US010079203B2

(12) United States Patent
Son et al.

(10) Patent No.: US 10,079,203 B2
(45) Date of Patent: Sep. 18, 2018

(54) VERTICAL MEMORY DEVICES AND METHODS OF MANUFACTURING THE SAME

(71) Applicants: Yong-Hoon Son, Yongin-si (KR); Cha-Dong Yeo, Suwon-si (KR); Han-Mei Choi, Seoul (KR); Kyung-Hyun Kim, Seoul (KR); Phil-Ouk Nam, Suwon-si (KR); Kwang-Chul Park, Suwon-si (KR); Yeon-Sil Sohn, Yongin-si (KR); Jin-I Lee, Hwaseong-si (KR); Won-Bong Jung, Seoul (KR)

(72) Inventors: Yong-Hoon Son, Yongin-si (KR); Cha-Dong Yeo, Suwon-si (KR); Han-Mei Choi, Seoul (KR); Kyung-Hyun Kim, Seoul (KR); Phil-Ouk Nam, Suwon-si (KR); Kwang-Chul Park, Suwon-si (KR); Yeon-Sil Sohn, Yongin-si (KR); Jin-I Lee, Hwaseong-si (KR); Won-Bong Jung, Seoul (KR)

(73) Assignee: Samsung Electronics Co., Ltd., Gyeonggie-do (KR)

(*) Notice: Subject to any disclaimer, the term of this patent is extended or adjusted under 35 U.S.C. 154(b) by 9 days.

(21) Appl. No.: 15/271,605

(22) Filed: Sep. 21, 2016

(65) Prior Publication Data

US 2017/0084532 A1    Mar. 23, 2017

(30) Foreign Application Priority Data

Sep. 23, 2015    (KR) .................. 10-2015-0134754

(51) Int. Cl.
*H01L 23/522* (2006.01)
*H01L 27/11582* (2017.01)
(Continued)

(52) U.S. Cl.
CPC .... *H01L 23/5226* (2013.01); *H01L 21/76816* (2013.01); *H01L 21/76877* (2013.01);
(Continued)

(58) Field of Classification Search
CPC ........... H01L 23/5226; H01L 21/76816; H01L 21/76877; H01L 23/528; H01L 23/53271; H01L 27/1157; H01L 27/11582
See application file for complete search history.

(56) References Cited

U.S. PATENT DOCUMENTS 7,679,133 B2    3/2010    Son et al.
8,187,932 B2    5/2012    Nguyen et al.
(Continued)

*Primary Examiner* — Laura Menz
*Assistant Examiner* — Candice Y Chan
(74) *Attorney, Agent, or Firm* — Harness, Dickey & Pierce, P.L.C.

(57) ABSTRACT

A vertical memory device includes a substrate, a plurality of channels on the substrate and extending in a vertical direction with respect to a top surface of the substrate, a plurality of non-metal gate patterns surrounding the channels and being stacked on top of each other and spaced apart from each other along the vertical direction, and a plurality of metal gate patterns stacked on top of each other. The metal gate patterns are spaced apart from each other along the vertical direction. Each of the metal gate patterns surrounds a corresponding one of the non-metal gate patterns.

15 Claims, 29 Drawing Sheets

(51) Int. Cl.
*H01L 21/768* (2006.01)
*H01L 27/11565* (2017.01)
*H01L 27/11575* (2017.01)
*H01L 27/1157* (2017.01)

(52) U.S. Cl.
CPC .. *H01L 27/11565* (2013.01); *H01L 27/11575* (2013.01); *H01L 27/11582* (2013.01); *H01L 27/1157* (2013.01)

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,654,587 B2 | 2/2014 | Yoon et al. |
| 8,860,119 B2 | 10/2014 | Kim et al. |
| 8,928,059 B2 | 1/2015 | Whang et al. |
| 8,933,502 B2 | 1/2015 | Higashitani et al. |
| 8,946,076 B2 | 2/2015 | Simsek-Ege et al. |
| 2011/0233648 A1 | 9/2011 | Seol et al. |
| 2014/0048868 A1 | 2/2014 | Kim et al. |
| 2014/0203346 A1 | 7/2014 | Lee |
| 2015/0035042 A1 | 2/2015 | Lee et al. |
| 2015/0072488 A1 | 3/2015 | Chien et al. |
| 2015/0099339 A1 | 4/2015 | Kim et al. |
| 2015/0115348 A1 | 4/2015 | Nam et al. |
| 2015/0118804 A1 | 4/2015 | Sasago et al. |

FIG. 4
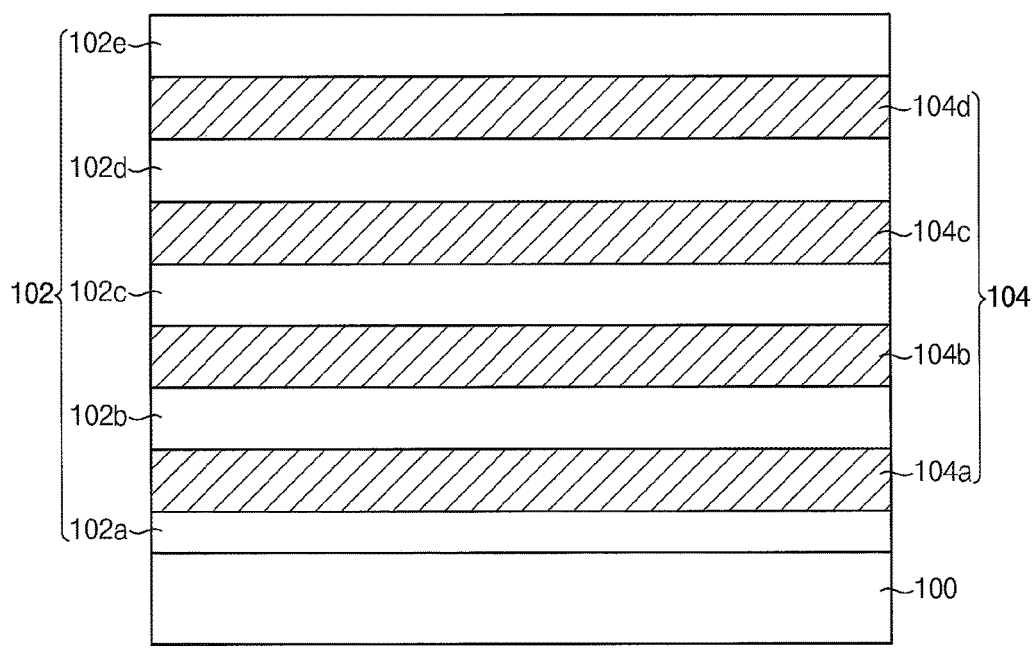
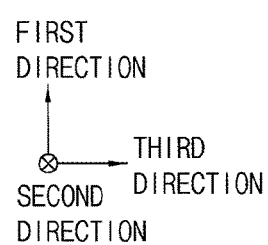

FIG. 5
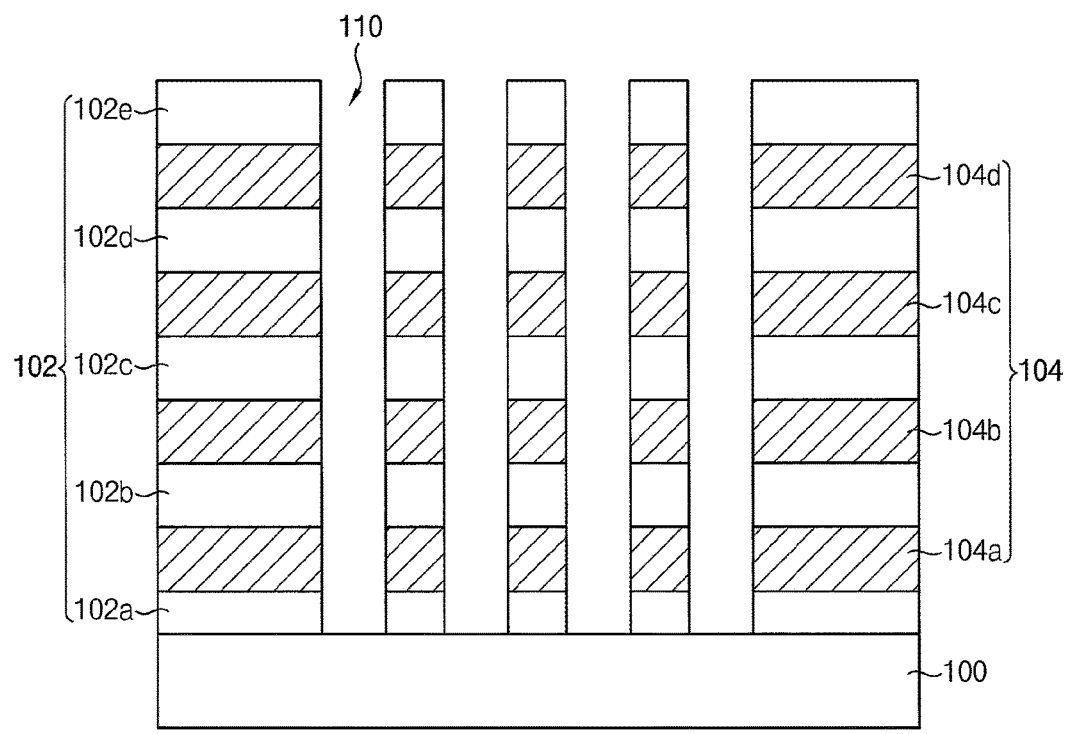
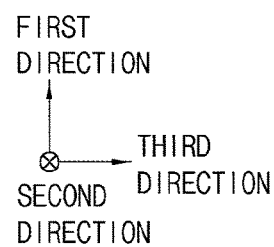

FIG. 6
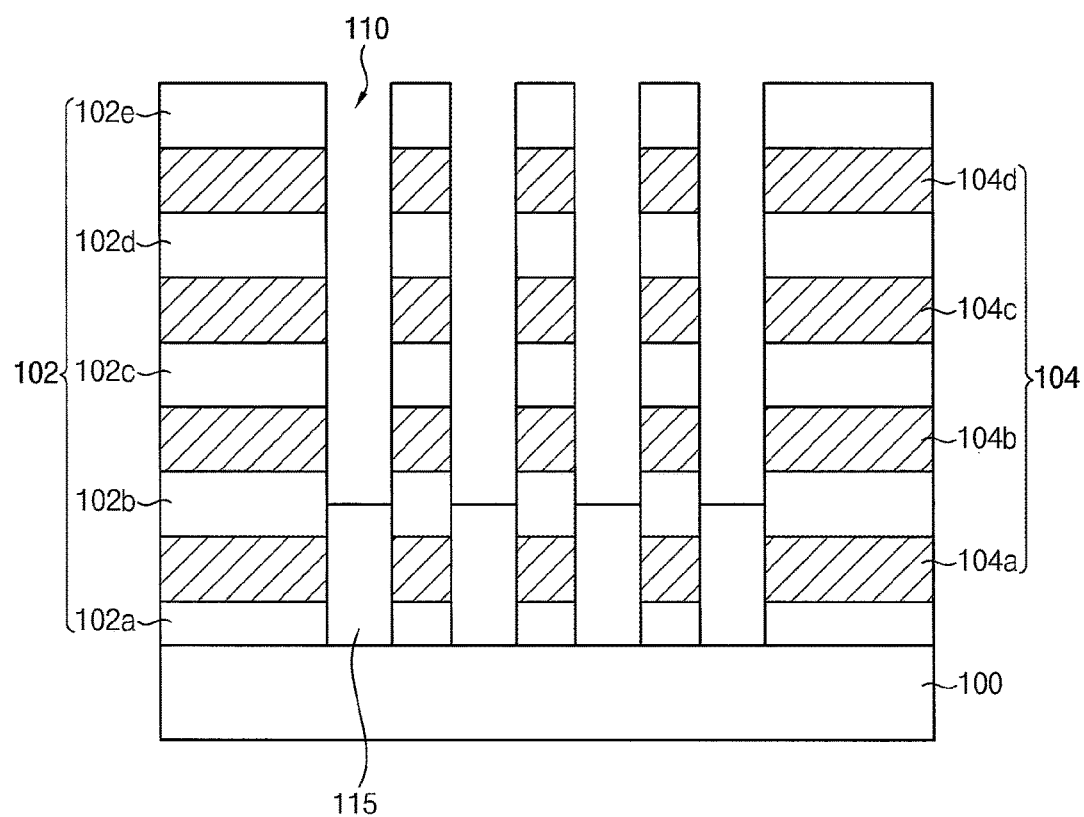
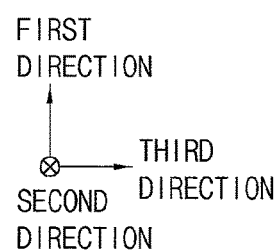

FIG. 8
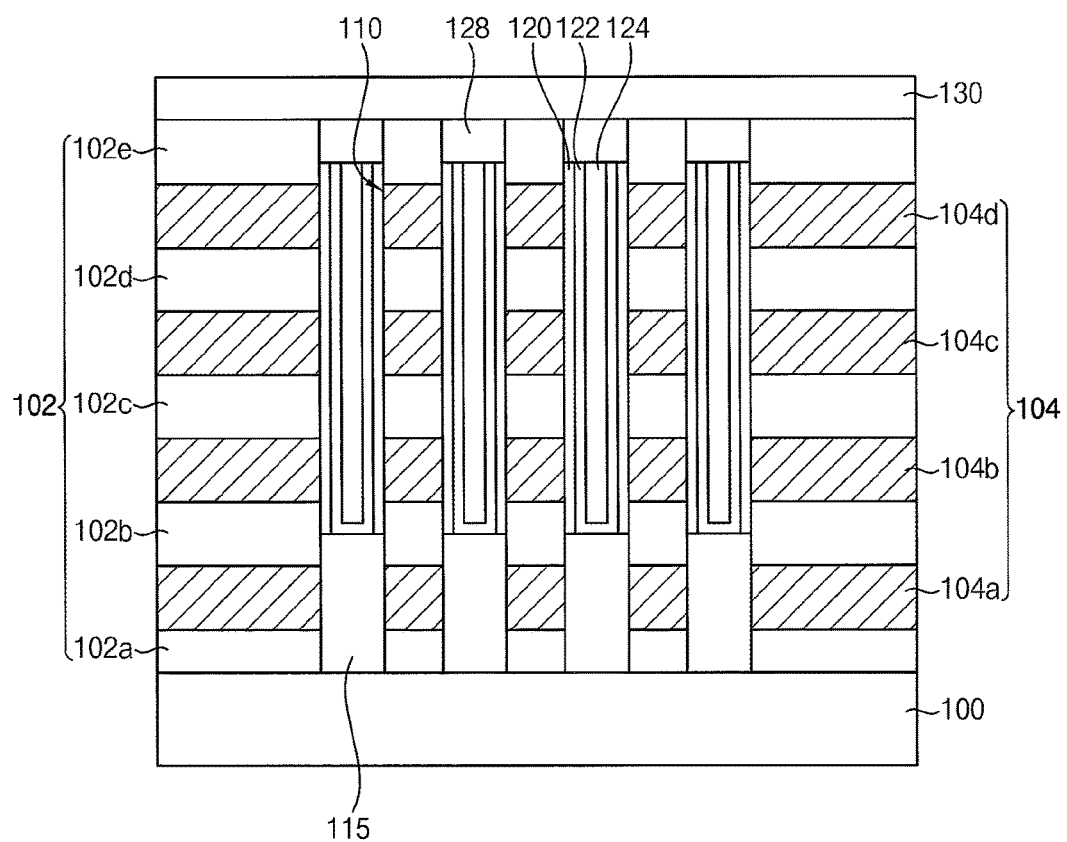
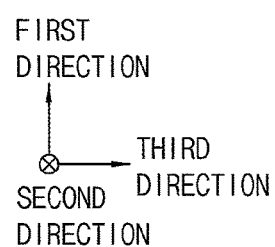

FIG. 11
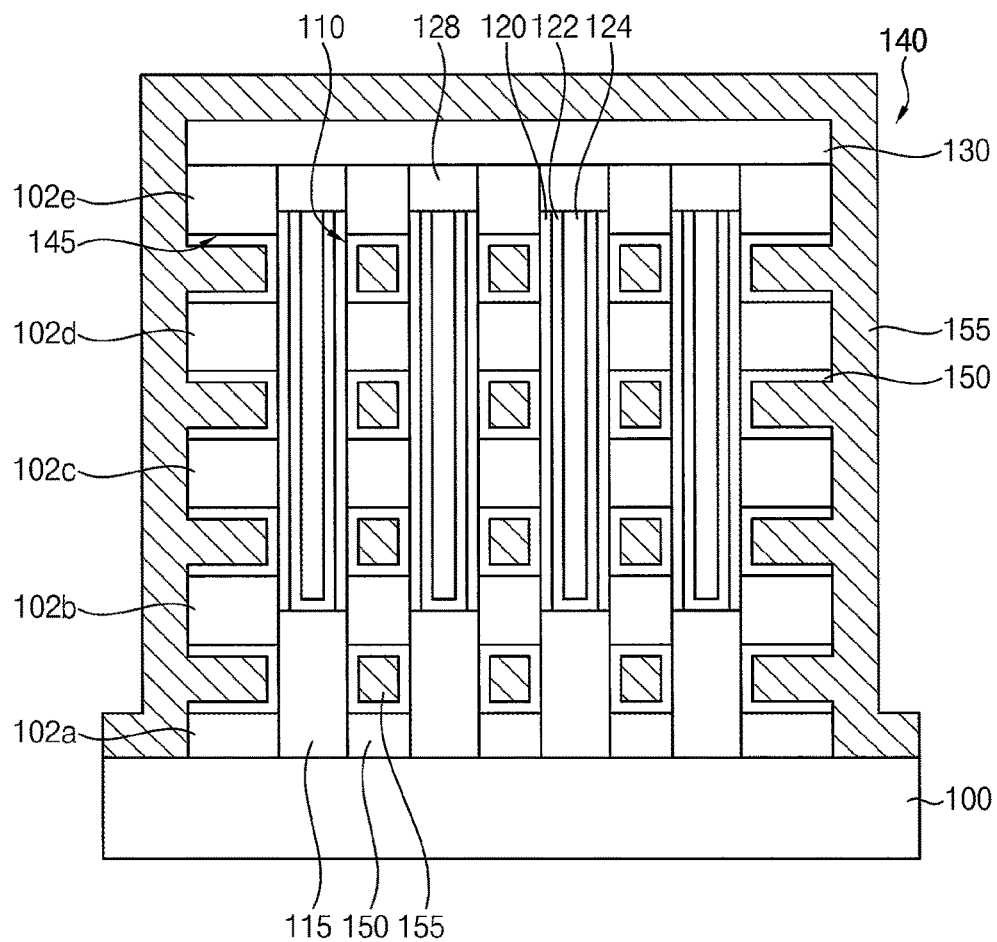
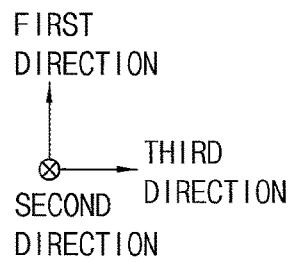

FIG. 13
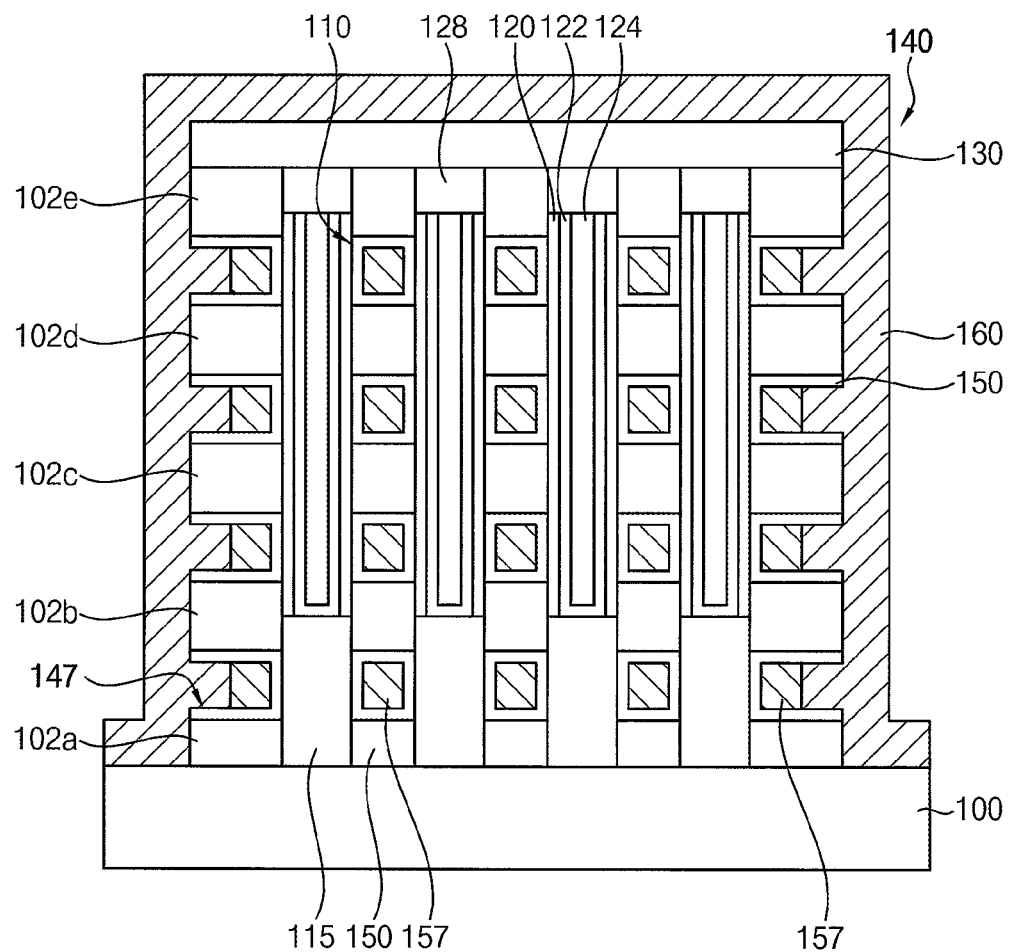
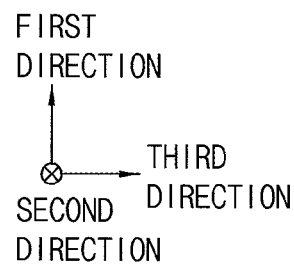

FIRST DIRECTION
SECOND DIRECTION
THIRD DIRECTION

VERTICAL MEMORY DEVICES AND METHODS OF MANUFACTURING THE SAME

CROSS-REFERENCE TO RELATED APPLICATION

This application claims priority under 35 USC § 119 to Korean Patent Application No. 10-2015-0134754, filed on Sep. 23, 2015 in the Korean Intellectual Property Office (KIPO), the contents of which are incorporated by reference herein in their entirety.

BACKGROUND

1. Field

Example embodiments relate to vertical memory devices and methods of manufacturing the same. More particularly, example embodiments relate to vertical memory devices including vertically stacked gate lines and methods of manufacturing the same.

2. Description of Related Art

Recently, a vertical memory device including a plurality of memory cells stacked vertically with respect to a surface of a substrate has been developed for achieving a high degree of integration. In the vertical memory device, a channel having a pillar shape or a cylindrical shape may protrude vertically from the surface of the substrate, and gate lines and insulation layers surrounding the channel may be repeatedly stacked.

As the degree of integration of the vertical memory device becomes greater, the stacked number of the gate lines and the insulation layers may increase, and thus higher mechanical stability may be needed.

SUMMARY

Example embodiments provide a vertical memory device having improved mechanical and electrical properties.

Example embodiments provide a method of manufacturing a vertical memory device having improved mechanical and electrical properties.

According to example embodiments, a vertical memory device includes a substrate, a plurality of channels, a plurality of non-metal gate patterns surrounding the channels, and a plurality of metal gate patterns. The channels extend in a vertical direction with respect to a top surface of the substrate. The non-metal gate patterns are stacked on top of each other and spaced apart from each other along the vertical direction. The plurality of metal gate patterns are stacked on top of each other and spaced apart from each other along the vertical direction. Each of the metal gate patterns may surround a corresponding one of the non-metal gate patterns.

In example embodiments, the non-metal gate patterns may include polysilicon.

In example embodiments, the metal gate patterns may include at least one of a metal and a metal silicide.

In example embodiments, the plurality of non-metal gate patterns and the plurality of metal gate patterns may define a plurality of gate lines. Each of the gate lines may include one of the non-metal gate patterns and one of the metal gate patterns at a same level. The plurality of the gate lines may be stacked on top of each other and spaced apart from each other along the vertical direction.

In example embodiments, the vertical memory device may further include insulating interlayers between the gate lines. The insulating interlayers may be stacked on top of each other and spaced apart from each other along the vertical direction.

In example embodiments, the vertical memory device may further include interface layers surrounding the gate lines. The interface layers may be between the insulating interlayers and the gate lines at each level.

In example embodiments, the interface layers may each include a first interface layer, a second interface layer on the first interface layer, and a third interface layer selectively surrounding one of the metal gate patterns. The first interface layer and the second interface layer may commonly surround one of the non-metal gate patterns and one of the metal gate patterns.

In example embodiments, the first interface layer may include a metal oxide, and the second interface layer and the third interface layer may include a metal nitride.

In example embodiments, a space between the channels may be fully filled with the interface layers and the non-metal gate patterns.

In example embodiments, the gate lines may be stacked in a stepped shape from the top surface of the substrate, and the gate lines at each level may include a step portion protruding in a horizontal direction.

In example embodiments, the step portion may consist essentially of the metal gate patterns.

In example embodiments, the metal gate patterns may include protrusions expanding in the vertical direction.

In example embodiments, the vertical memory device may further include contacts electrically connected to the step portion of the gate lines at each level.

According to example embodiments, there is provided a vertical memory device including a substrate, insulating interlayers stacked on top of each other and spaced apart from each other along a vertical direction with respect to a top surface of the substrate, a plurality of channels extending through the insulating interlayers in the vertical direction, a plurality of non-metal gate patterns stacked on top of each other and spaced apart from each other along the vertical direction and the non-metal gate patterns partially filling gaps defined by the insulating interlayers and the channels, and a plurality of metal gate patterns stacked on top of each other and spaced apart from each other along the vertical direction. The metal gate patterns fill remaining portions of the gaps.

In example embodiments, the gaps may include spaces between the channels. The spaces may be filled with the non-metal gate patterns, and the metal gate patterns may be only disposed around the non-metal gate patterns.

In example embodiments, the non-metal gate pattern at each level may be substantially fully covered by the insulating interlayer of each level in a plane view. The metal gate pattern at each level may include a step portion extending from the insulating interlayer of each level in a plane view.

In example embodiments, the step portion of the metal gate pattern may be thicker than the non-metal gate pattern at each level.

According to example embodiments, there is provided a method of manufacturing a vertical memory device. In the method, insulating interlayers and sacrificial layer may be alternately and repeatedly formed on a substrate to form a mold structure. A lateral portion of the mold structure may be etched in a stepwise manner to form a stepped mold structure. Additional sacrificial patterns may be formed on step portions of the stepped mold structure. Channels extending through a central portion of the stepped mold structure may be formed. An opening cutting the stepped mold structure may be formed. The sacrificial layers and the additional sacrificial patterns may be removed through the opening. Non-metal gate patterns partially filling gaps from which the sacrificial layers are removed may be formed. Metal gate patterns filling remaining portions of the gapes and filling expanded gaps from which the additional sacrificial patterns are removed may be formed.

In example embodiments, the insulating interlayers may be formed of an oxide. The sacrificial layers and the additional sacrificial patterns may be formed of a nitride.

In example embodiments, the non-metal gate patterns may be formed of polysilicon, and the metal gate patterns may be formed of a metal or a metal silicide.

According to example embodiments, a vertical memory device includes a substrate and a gate line stack structure on the substrate. The substrate includes a cell region and an extension region. The gate line stack structure includes a plurality of gate lines stacked on top of each other and spaced apart from each other in a first direction vertical to the substrate. Each of the gate lines extends in a second direction parallel to the substrate. Each of the gate lines includes a non-metal gate pattern on the cell region and a metal gate pattern on the extension region. The gate line stack structure includes vertical channel structures that are spaced apart from each other and extend in the first direction through the non-metal gate lines.

In example embodiments, the vertical memory device may include a plurality of gate line stack structures on the substrate. The gate line stack structures may include the gate line stack structure, and the gate line stack structures may be spaced part from each other in a third direction that is parallel to a top surface of the substrate and crosses the second direction.

In example embodiments, the gate line stack structure may further include a dummy channel structure on the cell region of the substrate adjacent to a boundary between the cell region and the extension region. The dummy channel structure may extend in the first direction through the non-metal gate lines.

In example embodiments, the plurality of gate lines may have widths that reduce from a top of the gate line stack structure to a bottom of the gate line stack structure such that a side of the gate line stack structure has a stepped structure.

In example embodiments, the vertical memory device may further include contacts connected to the metal gate lines. The non-metal gate lines and the metal gate lines may be formed of different materials.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIGS. 4 to 15 are cross-sectional views illustrating a method of manufacturing a vertical memory device in accordance with example embodiments;

DESCRIPTION OF EXAMPLE EMBODIMENTS

Figure 1:
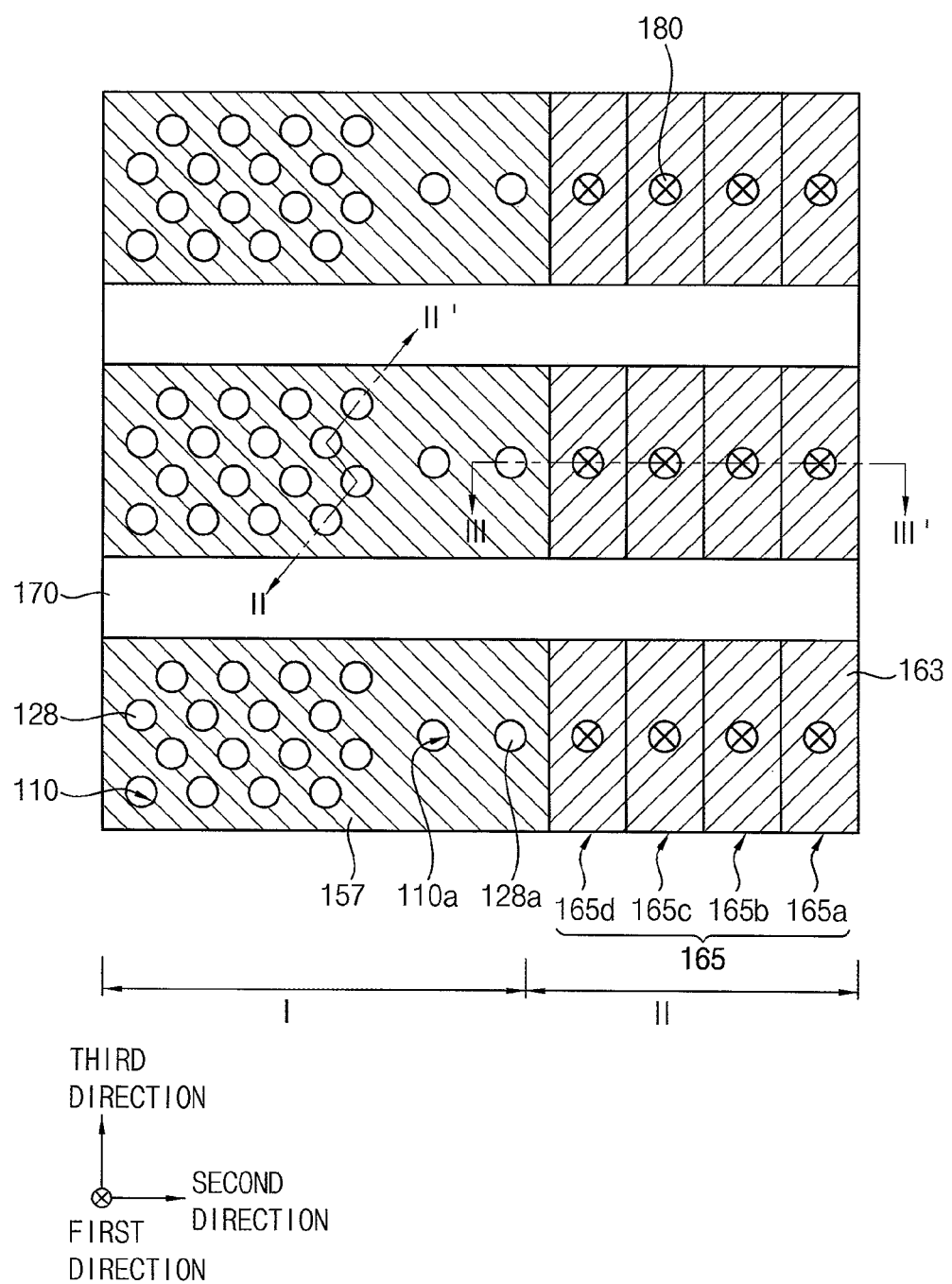
FIG. 1 is a top plan view illustrating a vertical memory device in accordance with example embodiments.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this description will be thorough and complete, and will fully convey the scope of inventive concepts to those skilled in the art. In the drawings, the sizes and relative sizes of layers and regions may be exaggerated for clarity. Like reference characters and/or numerals in the drawings denote like elements, and thus their description may not be repeated.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
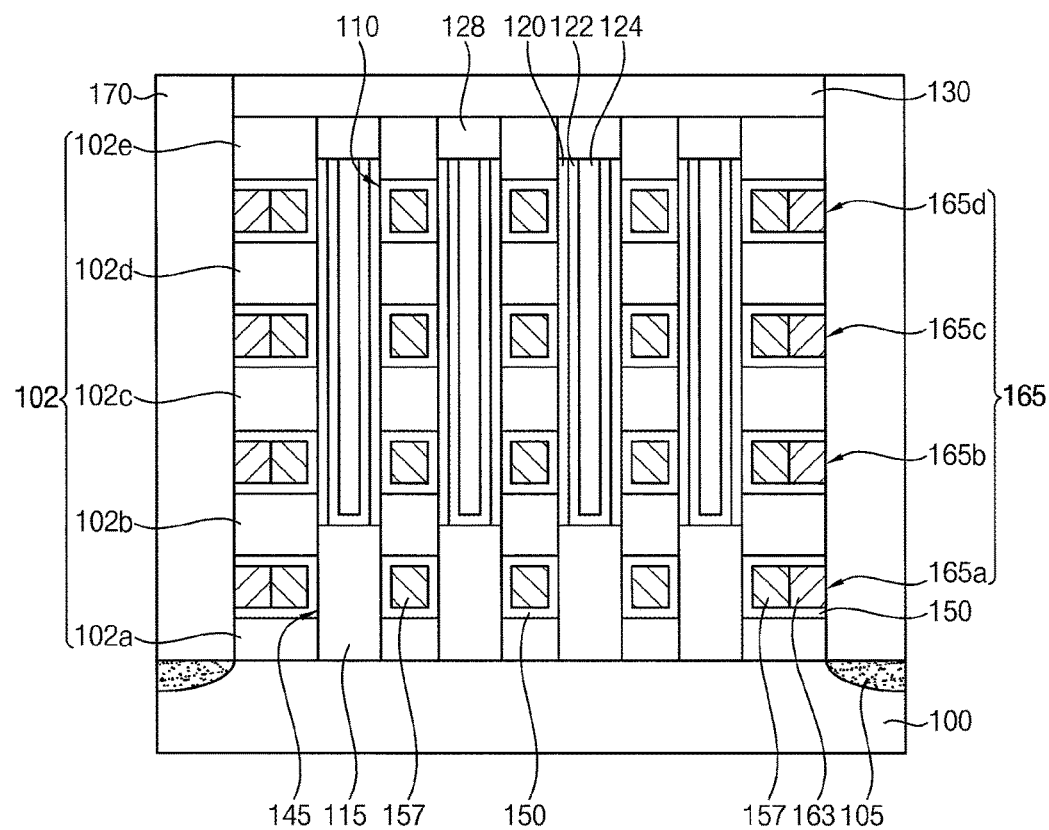
FIGS. 2 to 3 are cross-sectional views taken along lines II-II' and III-III' of FIG. 1.
Figure 3:
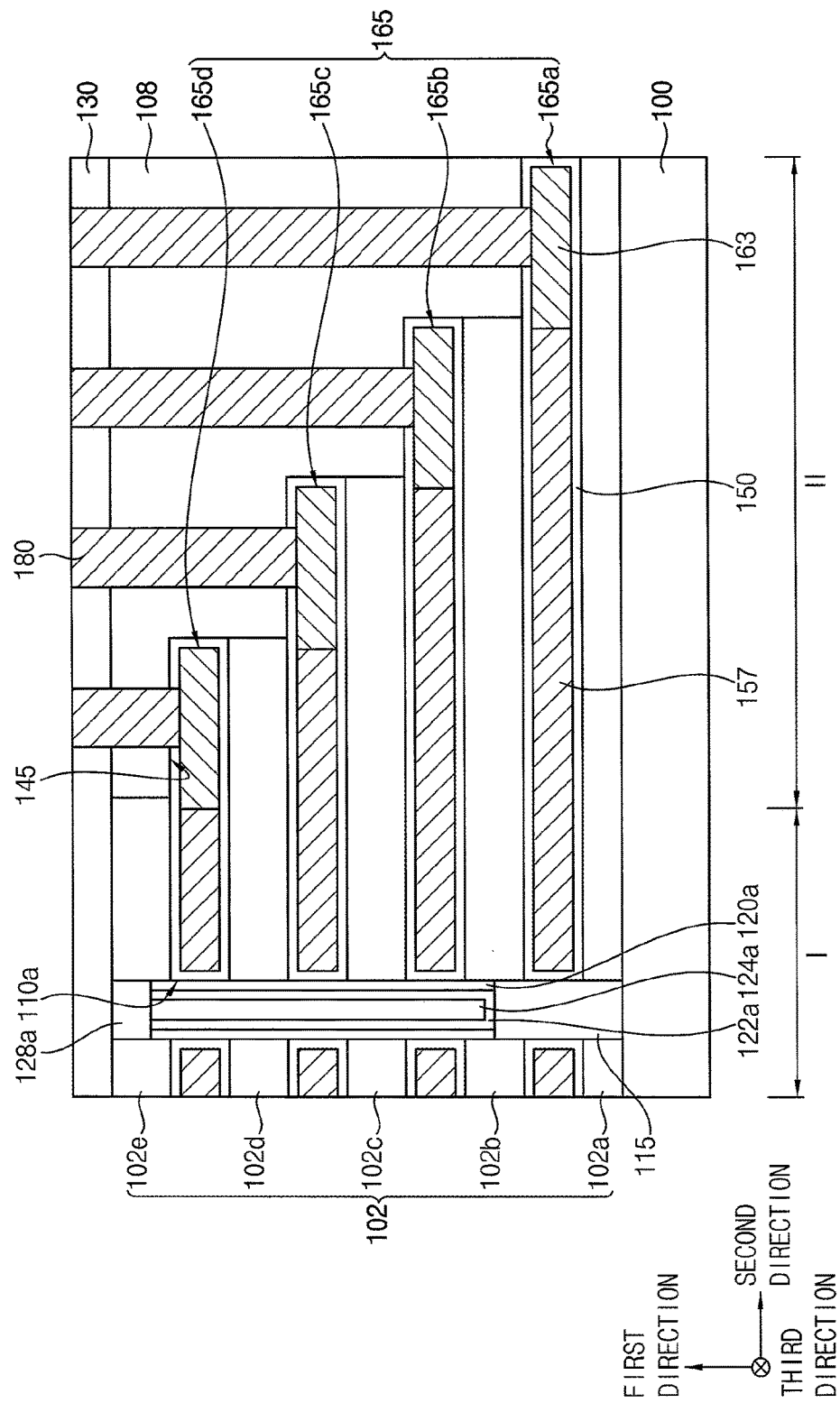

FIGS. 1 to 3 are a top plan view and cross-sectional views illustrating a vertical memory device in accordance with example embodiments.

Specifically, FIG. 1 is a top plan view illustrating the vertical memory device. FIGS. 2 and 3 are cross-sectional views taken along lines II-II' and III-III', respectively, indicated in FIG. 1.

A direction substantially vertical to a top surface of a substrate is referred to as a first direction, and two directions substantially parallel to the top surface of the substrate and substantially crossing each other are referred to as a second direction and a third direction. For example, the second direction and the third direction are substantially perpendicular to each other. Additionally, a direction indicated by an arrow and a reverse direction thereof are considered as the same direction. The above mentioned definitions of the directions are the same throughout all the figures in this specification.

Referring to FIGS. 1 to 3, the vertical memory device may include a vertical channel structure including a channel 122, a dielectric layer structure 120 and a filling insulation pattern 124 and extending in the first direction from a top surface of a substrate 100, gate lines 165 (e.g., 165a to 165d) surrounding the vertical channel structure and being stacked along the first direction as a stepped shape, and contacts 180 electrically connected to the gate lines 165.

The substrate 100 may include a semiconductor material, e.g., silicon and/or germanium. In example embodiments, the substrate 100 may include single crystalline silicon. For example, the substrate 100 may include a p-type well of the vertical memory device.

The vertical memory device may include a first region I and a second region II, and the substrate 100 may be also divided into the first region I and the second region II. In example embodiments, the first region I may be a cell region in which memory cells of the vertical memory device may be arranged. The second region II may be an extension region to which the gate lines 165 may extend in the second direction.

In example embodiments, a pair of the second regions II may be located symmetrically with respect to the first region I.

The vertical channel structure including the channel 122, the dielectric layer structure 120 and the filling insulation pattern 124 may extend in the first direction through the gate lines 165 and insulating interlayers 102 (e.g., 102a to 102d).

The channel 122 may be disposed on the substrate 100 of the first region I. The channel 122 may have a hollow cylindrical shape or a cup shape. The channel 122 may include polysilicon or single crystalline silicon, and may include p-type impurities such as boron (B) in a portion thereof.

The filling insulation pattern 124 may fill an inner space of the channel 122, and may have a solid cylindrical shape or a pillar shape. The filling insulation pattern 124 may include an insulation material such as silicon oxide. In example embodiments, the channel 122 may have a pillar shape or a solid cylindrical shape, and the filling insulation pattern 124 may be omitted.

The dielectric layer structure 120 may be formed along an outer sidewall of the channel 122, and may have a substantially straw shape.

The dielectric layer structure 120 may include a plurality of layers. For example, the dielectric layer structure 120 may include a tunnel insulation layer, a charge storage layer and a blocking layer which may be sequentially stacked from the outer sidewall of the channel 122. The blocking layer may include silicon oxide or a metal oxide such as hafnium oxide or aluminum oxide. The charge storage layer may include a nitride such as silicon nitride or a metal oxide, and the tunnel insulation layer pattern may include an oxide such as silicon oxide. For example, the dielectric layer structure 120 may have an oxide-nitride-oxide (ONO) layered structure.

As illustrated in FIG. 2, a semiconductor pattern 115 may be further disposed between the top surface of the substrate 100 and the vertical channel structure. In example embodiments, a channel hole 110 extending through the gate lines 165 and the insulating interlayers 102 in the first direction may be formed. The top surface of the substrate 100 may be exposed through the channel hole 110. The semiconductor pattern 115 may be formed at a lower portion of the channel hole 110, and may contact the top surface of the substrate 100. The channel 122 may be disposed on a top surface of the semiconductor pattern 115, and the dielectric layer structure 120 may be disposed on a peripheral portion of the top surface of the semiconductor pattern 115.

A pad 128 may be formed on the dielectric layer structure 120, the channel 122 and the filling insulation pattern 124. For example, an upper portion of the channel hole 110 may be capped by the pad 128.

The pad 128 may be electrically connected to, e.g., a bit line, and may serve as a source/drain region through which charges may be moved or transferred to the channel 122. The pad 128 may include polysilicon or single crystalline silicon, and may be optionally doped with n-type impurities such as phosphorus (P) or arsenic (As).

As illustrated in FIG. 1, a plurality of the pads 128 may be arranged along the second direction in the first region I such that a pad row may be defined, and a plurality of the pad rows may be arranged in the third direction. The vertical channel structures may be also arranged according to an arrangement of the pads 128. For example, a plurality of the vertical channel structures may be arranged in the first region I along the second direction to form a channel row, and a plurality of the channel rows may be arranged in the third direction.

In example embodiments, as illustrated in FIGS. 1 and 3, a dummy vertical channel structure may be disposed at a boundary between the first region I and the second region II. The dummy vertical channel structure may have a construction or a shape substantially the same as or similar to that of the vertical channel structure.

For example, the dummy vertical channel structure may be disposed on the semiconductor pattern 115, and may include a dummy channel 122a, a dummy dielectric layer structure 120a and a dummy filling insulation pattern 124a formed in a dummy channel hole 110a. A dummy pad 128a may be formed on the dummy vertical channel structure.

The dummy vertical channel structure may not be provided as the memory cell, and may serve as a supporting pillar. Accordingly, a structural stability of the vertical memory device may be improved.

The gate lines 165 (e.g., 165a through 165d) may be formed on an outer sidewall of the dielectric layer structure 120 or the semiconductor pattern 115, and may be spaced apart from each other along the first direction. In example embodiments, each of the gate lines 165 may partially surround the channels 122 or the vertical channel structures included in at least one channel row, and may extend in the second direction.

In example embodiments, one of the gate lines 165 may surround the channel rows corresponding to four pad rows. In this case, a gate line stack structure may be defined by 4 channel rows and the gate lines 165 surrounding the 4 channel rows. A plurality of the gate line stack structures may be arranged along the third direction.

In example embodiments, widths or length of the gate lines 165 may be reduced along the first direction from the top surface of the substrate 100. For example, as illustrated in FIGS. 1 and 3, a plurality of the gate lines 165 may be stacked in a pyramidal shape or a stepped shape along the first direction. Accordingly, the gate line 165 of each level may include a step portion protruding in the second direction from an upper gate line 165. The step portion of each gate line 165 may serve as contact pad on which the contact 180 may be landed.

The gate lines 165 may include a ground selection line (GSL), a word line and a string selection line (SSL). For example, a lowermost gate line 165a may serve as the GSL and an uppermost gate line 165d may serve as the SSL. The gate lines 165b and 165c between the GSL and the SSL may serve as the word lines.

The GSL (e.g., the gate line 165a) may surround the outer sidewall of the semiconductor pattern 115 and may extend in the second direction. The word lines (e.g., the gate lines 165b and 165c) and the SSL (e.g., the gate line 165d) may surround outer sidewalls of the channel 122 and the dielectric layer structure 120, and may extend in the second direction.

The gate lines 165 may be formed at increased levels in consideration of a circuit design and a degree of integration of the vertical memory device, e.g. 16 levels, 24 levels, 32 levels, 48 levels, etc. In other words, although FIG. 3 illustrates four gate lines 165a to 165d alternately stacked on top of each other with insulating interlayers 102e, the number of gate lines 165 and insulating interlayers 102 may be increased or decreased depending on a desired degree of integration.

The insulating interlayers 102 (e.g., 102a through 102e) may be disposed between the gate lines 165 neighboring in the first direction. The insulating interlayers 102 may include a silicon oxide-based material, e.g., silicon dioxide ($SiO_2$), silicon oxycarbide (SiOC) or silicon oxyfluoride (SiOF). The gate lines 165 included in one of the gate line stack structures may be insulated from each other by the insulating interlayers 102. The insulating interlayers 102 may be stacked along the first direction in a pyramidal shape or a stepped shape substantially the same as or similar to that of the gate lines 165.

In example embodiments, the gate line 165 at each level may include a non-metal gate pattern 157 and a metal gate pattern 163.

The non-metal gate pattern 157 may be located at a central portion of the gate line stack structure, and may surround the channel rows. A space between the vertical channel structures neighboring each other may be filled with the non-metal gate pattern 157. In example embodiments, the non-metal gate pattern 157 may include polysilicon optionally doped with impurities.

The metal gate pattern 163 may be located at a peripheral portion of the gate line stack structure. In example embodiments, the metal gate pattern 163 may laterally surround the non-metal gate pattern 157.

The metal gate pattern 163 may be selectively formed at the peripheral portion of the gate line stack structure. Thus, the metal gate pattern 163 may be excluded from the space between the vertical channel structures neighboring each other.

In example embodiments, as illustrated in FIGS. 1 and 3, the step portion of the gate line 165 may consist essentially of the metal gate pattern 163, and may not include the non-metal gate pattern 157. For example, the non-metal gate pattern 157 may be substantially fully covered by the insulating interlayer 102 at an upper level thereof, and may not extend to an outside of the insulating interlayer 102.

In example embodiments, the metal gate pattern 163 may be exposed at the outside of the insulating interlayer 102 in the second region II, and may be partially covered by the insulating interlayer 102 at an upper level thereof.

The metal gate pattern 163 may include a metal having a low electrical resistance, e.g., tungsten (W). In example embodiments, the metal gate pattern 163 may include a metal silicide such as a nickel silicide (NiSi) or cobalt silicide (CoSi).

The gate line 165 at each level may be surrounded by an interface layer 150. The interface layer 150 may be formed between the dielectric layer structure 120 and the gate line 165, and between the insulating interlayer 102 and the gate line 165.

The interface layer 150 may be provided for controlling a work function between the channel 122 and the gate line 165. The interface layer 150 may include, e.g., a metal oxide and/or a metal nitride. The metal oxide may include, e.g., an aluminum oxide, and the metal nitride may include, e.g., titanium nitride, tantalum nitride and/or tungsten nitride.

A mold protection layer 108 (see FIG. 3) may be formed on a lateral portion of the gate line stack structure. The step portions of the gate lines 165 may be covered by the mold protection layer 108.

A cutting pattern 170 may be interposed between the gate line stack structures. For example, the cutting pattern 170 may intersect the gate lines 165, the insulating interlayer 102 and the mold protection layer 108, and may have a fence shape extending in the second direction. The gate lines stack structure including the desired (and/or alternatively predetermined) number of the channel rows may be defined by the cutting pattern 170.

An upper insulation layer 130 may be formed on the mold protection layer 108 and the gate line stack structure.

The mold protection layer 108 and the cutting pattern 170 may include an insulation material, e.g., silicon oxide.

An impurity region 105 (see FIG. 2) may be formed at an upper portion of the substrate 100 under the cutting pattern 170. The impurity region 105 may extend in the second direction, and may serve as a common source line (CSL) of the vertical memory device.

In example embodiments, a CSL contact or a CSL pattern electrically connected to the impurity region 105 may be formed through the cutting pattern 170.

The contacts 180 may be disposed in the second region II, and may be electrically connected to the gate lines 165. For example, the contacts 180 may extend through the upper insulation layer 130, the mold protection layer 108 and the interface layer 150, and each contact 180 may be in contact with the step portion of the gate line 165 at each level. The contact 180 may include a metal, a metal nitride, doped polysilicon and/or a metal silicide.

As described above, the step portion of the gate line 165 may consist essentially of the metal gate pattern 163. The contact 180 may be in contact with the metal gate pattern 163 including the metal such as W or the metal silicide so that an electrical resistance for transferring a signal through the contact 180 may be reduced.

In a comparative example, gate lines included in a gate line stack structure may include a metal such as W. As the number of levels included in the gate line stack structure increases, an amount or a total volume of the metal may also increase. As a result, a warpage of the gate line stack structure may be exacerbated due to a coefficient of thermal expansion (CTE) mismatch of the metal.

However, according to example embodiments as described above, a central portion of the gate line 165 at each level may consist essentially of the non-metal gate pattern 157 containing, e.g., polysilicon. Further, a peripheral portion or the step portion of the gate line 165 at each level may consist essentially of the metal gate pattern 163. Thus, an amount of the metal included in the gate line stack structure may be reduced from a volume of the non-metal gate pattern 157, and thus a warpage of the gate line stack structure may be reduced and/or avoided.

Additionally, the contact 180 may be connected to the metal gate pattern 163 of the gate line 165, and thus a resistance increase from an inclusion of the non-metal gate pattern 157 may be limited (and/or prevented).

FIGS. 4 to 15 are cross-sectional views illustrating a method of manufacturing a vertical memory device in accordance with example embodiments. For example, FIGS. 4 to 15 illustrate a method of manufacturing the vertical memory device described with reference to FIGS. 1 to 3.

Specifically, FIGS. 4 to 15 are cross-sectional views taken along a line II-II' indicated in FIG. 1, and illustrate processes performed in the first region I.

Referring to FIG. 4, insulating interlayers 102 (e.g., 102a through 102e) and sacrificial layers 104 (e.g., 104a through 104d) may be alternately and repeatedly formed on a substrate 100 to form a mold structure.

A semiconductor substrate including, e.g., single crystal-line silicon and/or germanium may be used as the substrate 100. The substrate 100 may be divided into a first region I and a second region II as illustrated in FIG. 3.

The insulating interlayer 102 may be formed of an oxide-based material, e.g., silicon dioxide, silicon oxycarbide and/or silicon oxyfluoride. The sacrificial layer 104 may be formed of a material that may have an etching selectivity with respect to the insulating interlayer 102 and may be easily removed by a wet etching process. For example, the sacrificial layer 104 may be formed of a nitride-based material, e.g., silicon nitride and/or silicon boronitride.

The insulating interlayer 102 and the sacrificial layer 104 may be formed by at least one of a chemical vapor deposition (CVD) process, a plasma enhanced chemical vapor deposition (PECVD) process, a high density plasma chemical vapor deposition (HDP-CVD) process, an atomic layer deposition (ALD) process or a sputtering process.

In example embodiments, a lowermost insulating interlayer 102a may be formed by a thermal oxidation process or a radical oxidation process on a top surface of the substrate 100. In example embodiments, an uppermost insulating interlayer (e.g., 102e) may have a relatively large thickness in consideration of a formation of a pad 128 (see FIG. 8).

The sacrificial layers 104 may be removed in a subsequent process to provide spaces for a GSL, a word line, and an SSL. Thus, the number of the insulating interlayers 102 and the sacrificial layers 104 may be determined in consideration of the number of the GSL, the word line and the SSL. FIG. 4 illustrates that the sacrificial layers 104 and the insulating interlayers 102 are formed at 4 levels and 5 levels, respectively. However, the number of the insulating interlayers 102 and the sacrificial layers 104 may be increased depending on a degree of integration of the vertical memory device.

In example embodiments, a lateral portion of the mold structure may be partially etched in, e.g., a stepwise manner such that the mold structure may be converted as a stepped mold structure including a plurality of steps or stairs in the second region II. A mold protection layer 108 (see FIG. 3) may be further formed on the second region II to cover the plurality of the steps Referring to FIG. 5, a channel hole 110 may be formed through the mold structure.

For example, a hard mask (not illustrated) may be formed on an uppermost insulating interlayer 102e. The insulating interlayers 102 and the sacrificial layers 104 of the mold structure may be partially etched by performing, e.g., a dry etching process. The hard mask may be used as an etching mask to form the channel hole 110. A top surface of the substrate 100 may be partially exposed by the channel hole 110. The channel hole 110 may extend in the first direction from the top surface of the substrate 100. The hard mask may be formed of silicon-based or carbon-based spin-on hardmask (SOH) materials, and/or a photoresist material.

As illustrated in FIG. 1, a plurality of the channel holes 110 may be formed in the second direction to form a channel hole row. A plurality of the channel hole rows may be formed in the third direction. The channel hole rows may be arranged such that the channel holes 110 may be formed in a zigzag arrangement along the third direction.

The hard mask may be removed by an ashing process and/or a strip process after the formation of the channel holes 110.

In example embodiments, as illustrated in FIG. 1, a dummy channel hole 110a may be formed concurrently with the channel hole 110 at a boundary between the first region I and the second region II.

Referring to FIG. 6, a semiconductor pattern 115 filling a lower portion of the channel hole 110 may be formed.

In example embodiments, the semiconductor pattern 115 may be formed by a selective epitaxial growth (SEG) process using the top surface of the substrate 100 exposed through the channel hole 110 as a seed. Alternatively, an amorphous silicon layer filling the lower portion of the channel hole 110 may be formed, and then a laser epitaxial growth (LEG) process or a solid phase epitaxy (SPE) process may be performed on the amorphous silicon layer to form the semiconductor pattern 115.

In example embodiments, as illustrated in FIG. 3, the semiconductor pattern 115 may be also formed at a lower portion of the dummy channel hole 110a.

Figure 7:
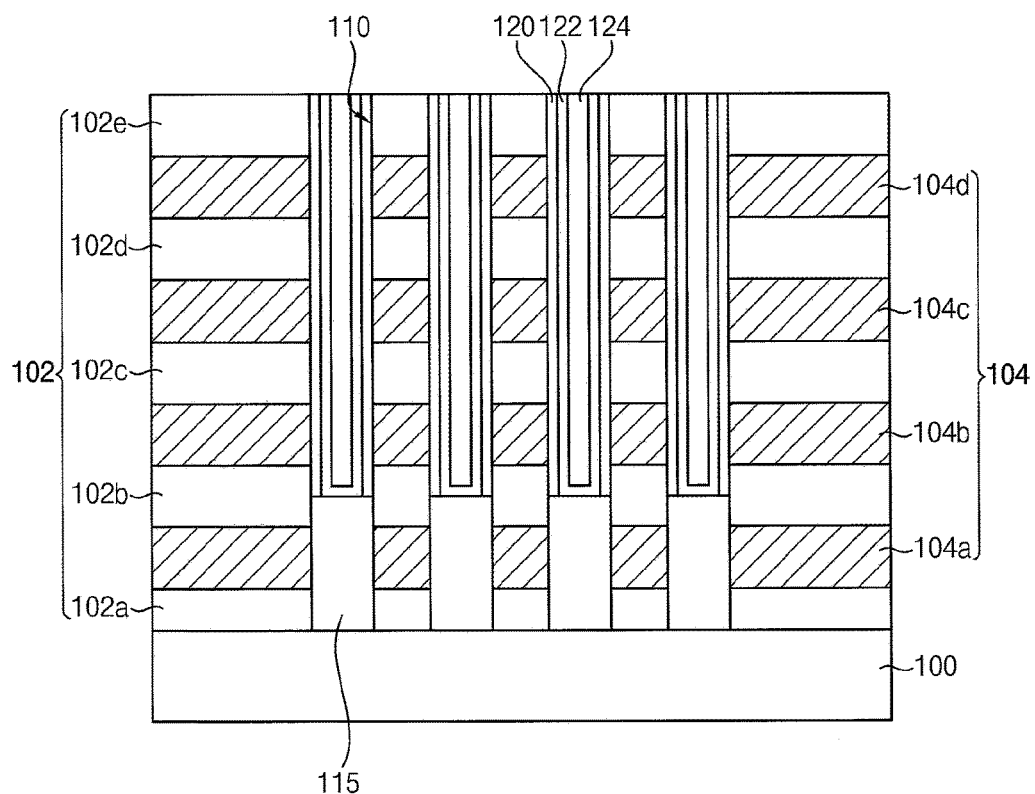

Referring to FIG. 7, a vertical channel structure including a dielectric layer structure 120, a channel 122 and a filling insulation pattern 124 may be formed in the channel hole.

In example embodiments, a dielectric layer may be formed along a top surface of the uppermost insulating interlayer 102e, a sidewall of the channel hole 110 and a top surface of the semiconductor pattern 115. For example, portions of the dielectric layer formed on the top surfaces of the uppermost insulating interlayer 102e and the semiconductor pattern 115 may be removed by, e.g., an etch-back process. Accordingly, the dielectric layer structure 120 having, e.g., a straw shape may be formed on the sidewall of the channel hole 110.

Subsequently, a channel layer may be formed along the uppermost insulating interlayer 102e, a sidewall of the dielectric layer structure 120 and the top surface of the semiconductor pattern 115. A filling insulation layer filling a remaining portion of the channel hole 110 may be formed on the channel layer. Upper portions of the channel layer and the filling insulation layer may be planarized by, e.g., a chemical mechanical polish (CMP) process until the top surface of the uppermost insulating interlayer 102e may be exposed. Accordingly, the channel 122 and the filling insulation pattern 124 filling the channel hole 110 may be formed on the semiconductor pattern 115.

The dielectric layer may be formed by sequentially forming a blocking layer, a charge storage layer and a tunnel insulation layer. For example, the blocking layer may be formed using an oxide, e.g., silicon oxide, the charge storage layer may be formed using silicon nitride or a metal oxide, and the tunnel insulation layer may be formed using an oxide, e.g., silicon oxide. In example embodiments, the dielectric layer may be formed as an ONO layered structure. The blocking layer, the charge storage layer and the tunnel insulation layer may be formed by a CVD process, a PECVD process, an ALD process, etc.

The channel layer may be formed of polysilicon or amorphous silicon which is optionally doped with impurities. In example embodiments, a heat treatment or a laser beam irradiation may be further performed on the channel layer. In this case, the channel layer may be transformed to include single crystalline silicon. The filling insulation layer may be formed using, e.g., silicon oxide or silicon nitride. The channel layer and the filling insulation layer may be formed by a CVD process, a PECVD process, an ALD process, a PVD process, a sputtering process, etc.

The channel 122 may have a substantially cup shape, and the filling insulation pattern 124 may have a pillar shape inserted in the channel 122. In example embodiments, the formation of the filling insulation layer may be omitted. In this case, the channel 122 may have a pillar shape filling the channel hole 110.

In example embodiments, a dummy vertical channel structure having a construction substantially the same as or similar to that of the vertical channel structure may be formed in the dummy channel hole 110a.

As illustrated in FIG. 3, the dummy vertical channel structure may include a dummy channel 122a, a dummy dielectric layer structure 120a and a dummy filling insulation pattern 124a.

Referring to FIG. 8, the pad 128 capping an upper portion of the channel hole 110 may be formed.

For example, upper portions of the dielectric layer structure 120, the channel 122 and the filling insulation pattern 124 may be partially removed by, e.g., an etch-back process to form a recess. A pad layer may be formed on the dielectric layer structure 120, the channel 123, the filling insulation pattern 124 and the uppermost insulating interlayer 102e to sufficiently fill the recess. An upper portion of the pad layer may be planarized by, e.g., a CMP process until the top surface of the uppermost insulating interlayer 102e may be exposed to form the pad 128.

In example embodiments, the pad layer may be formed using polysilicon optionally doped with n-type impurities. In example embodiments, a preliminary pad layer including amorphous silicon may be formed, and then a crystallization process may be performed thereon to form the pad layer.

In example embodiments, as illustrated in FIG. 3, a dummy pad 128a capping an upper portion of the dummy channel hole 128a may be formed on the dummy vertical channel structure.

According to the arrangement of the channel hole row as described above, a plurality of the pads 128 may be arranged along the second direction to define a pad row. Further, a channel row may be defined under the pad row, and a plurality of the channel rows may be arranged along the third direction.

An upper insulation layer 130 may be formed on the uppermost insulating interlayer 102e, the pad 128, the dummy pad 128a and the mold protection layer 108. The upper insulation layer 130 may be formed of, e.g., silicon oxide by a CVD process, a spin coating process, etc.

Figure 9:
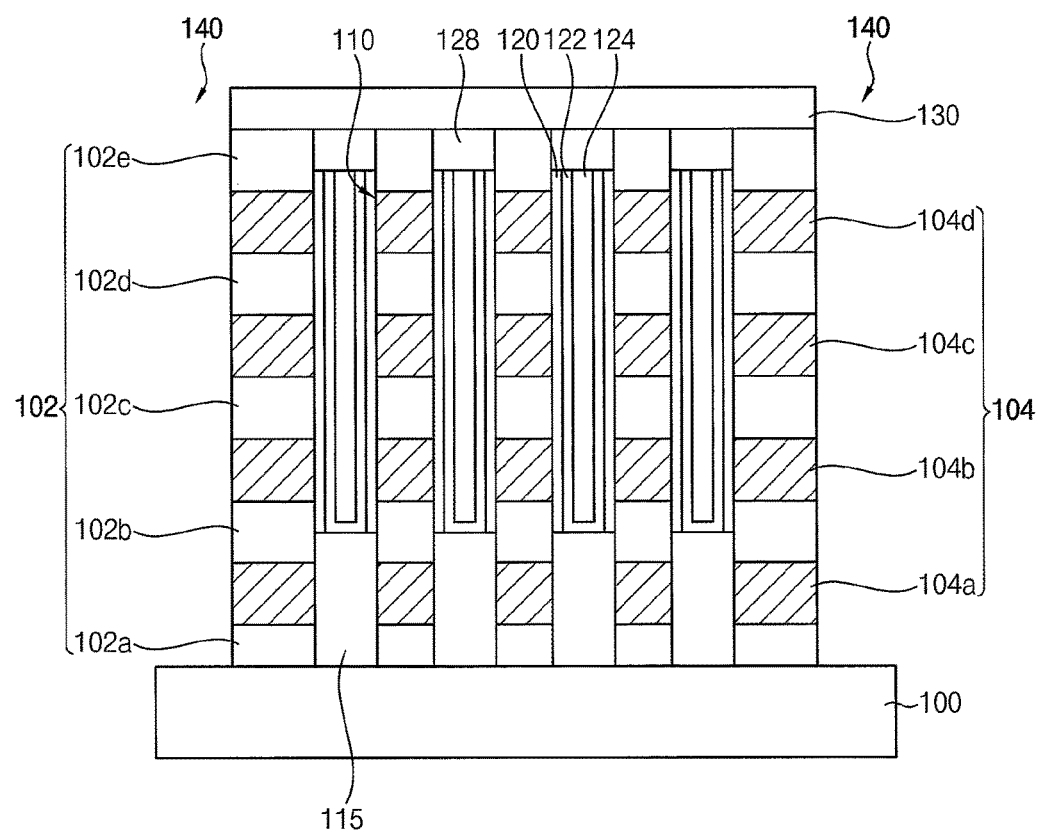

Referring to FIG. 9, an opening 140 cutting the mold structure may be formed.

For example, a hard mask (not illustrated) covering the pads 128 and partially exposing the upper insulation layer 130 between some of the channel rows neighboring in the third direction may be formed. The upper insulation layer 130, the insulating interlayers 102 and the sacrificial layers 104 may be partially etched by, e.g., a dry etching process using the hard mask as an etching mask to form the opening 140. The hard mask may be formed using a photoresist material or an SOH material. The hard mask may be removed by an ashing process and/or a strip process after the formation of the opening 140.

The opening 140 may extend in the second direction, and a plurality of the openings 140 may be formed along the third direction. The desired (and/or alternatively predetermined) number of the channel rows may be arranged between the openings 140 neighboring in the third direction. For example, as illustrated in FIG. 1 or 9, four channel rows may be included between the neighboring openings 140. However, the number of the channel rows between the openings 140 may be properly adjusted in consideration of a circuit design or a degree of integration of the vertical memory device.

In example embodiments, the top surface of the substrate 100 may be exposed through the opening 140, and sidewalls of insulating interlayers 102 and the sacrificial layers 104 may be also exposed.

Figure 10:
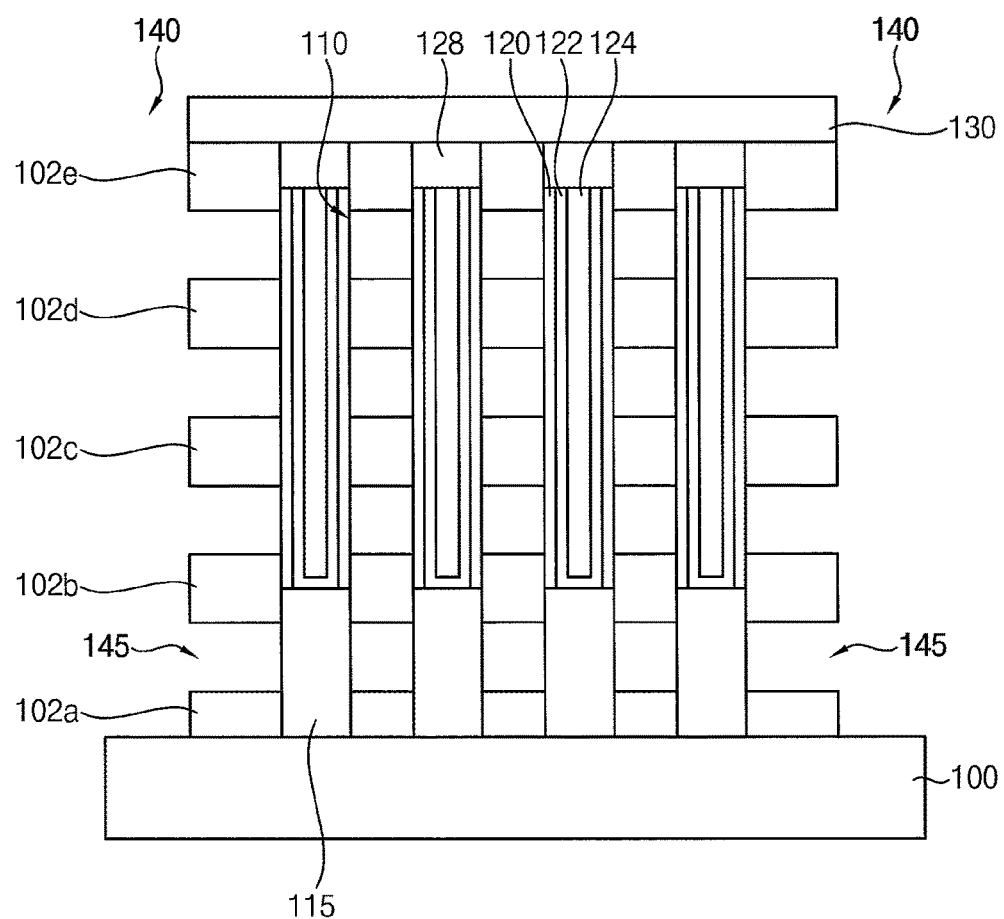

Referring to FIG. 10, the sacrificial layers 104 may have sidewalls exposed by the opening 140. The sacrificial layers 104 may be removed. In example embodiments, the sacrificial layers 104 may be removed by a wet etching process using an etchant solution, e.g., phosphoric acid that may have an etching selectivity for silicon nitride.

A gap 145 may be defined by a space from which the sacrificial layer 104 is removed. A plurality of the gaps 145 may be formed along the first direction and between the insulating interlayers 102. Outer sidewalls of the dielectric layer structure 120 may be partially exposed by the gap 145. A sidewall of the semiconductor pattern 115 may be exposed by the gap 145 at a lowermost level.

Referring to FIG. 11, an interface layer 150 may be formed an inner wall of the gap 145 at each level, and a non-metal gate layer 155 filling remaining portions of the gaps 145 and at least partially filling the opening 140 may be formed.

The interface layer 150 may be formed on a top surface and a bottom surface of the insulating interlayers 102 defining the gap 145, and on the outer sidewall of the dielectric layer structure 120. In example embodiments, the interface layer 150 may be also formed on the sidewall of the insulating interlayer 102 exposed by the opening 140.

The interface layer 150 may be formed of a metal oxide and/or a metal nitride by, e.g., an ALD process or a sputtering process.

In example embodiments, the non-metal gate layer 155 may be formed of polysilicon by, e.g., a CVD process or an ALD process. The non-metal gate layer 155 may extend on a top surface of the upper insulation layer 130 while at least partially filling the opening 140.

Figure 12:
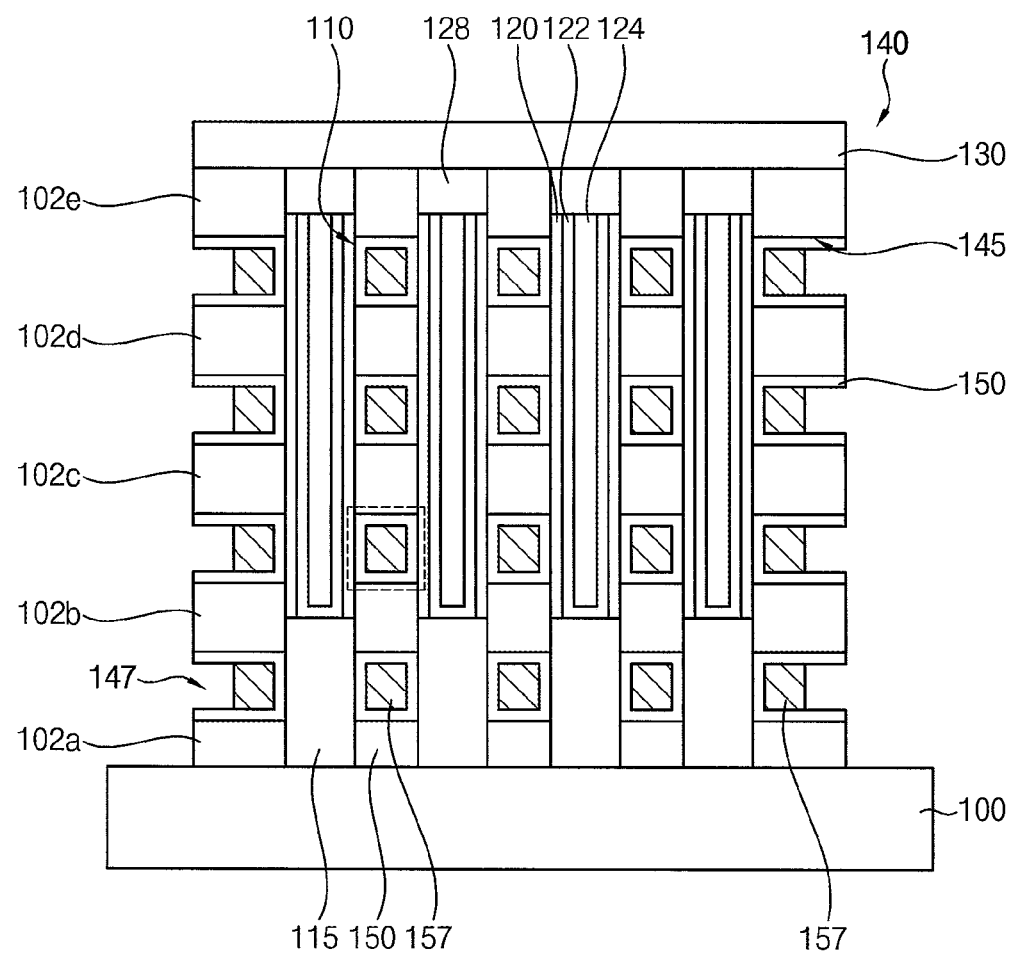

Referring to FIG. 12, the non-metal gate layer 155 may be partially removed to form a non-metal gate pattern 157 partially filling the gap 145 at each level.

In example embodiments, a portion of the non-metal gate layer 155 formed on the top surface of the upper insulation layer 130 may be removed by a CMP process. A portion of the non-metal gate layer 155 formed in the opening 140 may be additionally removed by, e.g., a gas phase etching (GPE) process using a chlorine ($Cl_2$) gas.

A portion of the non-metal gate layer 155 formed in the gap 145 may be also partially removed by the etching process. Accordingly, the non-metal gate pattern 157 partially filling the gap 145 may be formed.

The non-metal gate pattern 157 may extend in the second direction and surround the channel rows between the neighboring openings 140. A remaining portion of the gap 145 except for the non-metal gate pattern 157 may be defined as a recess 147.

In example embodiments, a space between the vertical channel structures neighboring each other (designated as a dotted quadrangle in FIG. 12) may be substantially fully filled with the non-metal gate pattern 157.

Referring to FIG. 13, a metal gate layer 160 filling the recess 147 at each level and the opening 140 may be formed.

In example embodiments, the metal gate layer 160 may fully fill the recesses 147, and may partially fill the opening 140. The metal gate layer 160 may also extend on the top surface of the upper insulation layer 130.

The metal gate layer 160 may be formed of a low resistance metal, e.g., tungsten by a sputtering process or an ALD process.

Figure 14:
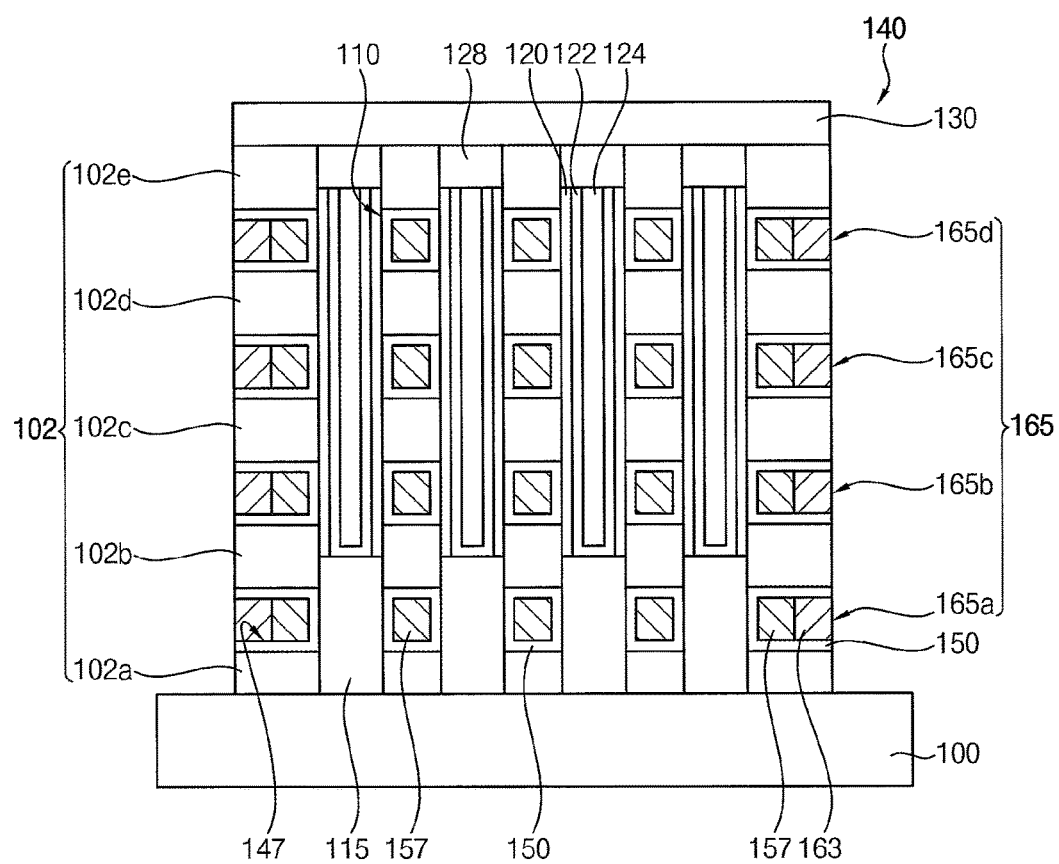

Referring to FIG. 14, the metal gate layer 160 may be partially etched to form a metal gate pattern 163 filling the recess 147 at each level.

For example, a portion of the metal gate layer 160 formed on the top surface of the upper insulation layer 130 may be removed by a CMP process, and a portion of the metal gate layer 160 formed in the opening 140 may be removed by, e.g., an isotropic etching process. Accordingly, the metal gate layer 160 may be separated along the first direction to form the metal gate pattern 163 in the recess 147 at each level.

A gate line 165 may be defined by the non-metal gate pattern 157 and the metal gate pattern 163. The gate lines 165 (e.g., 165a through 165d) may be formed to be spaced apart from each other along the first direction.

The gate lines 165 may include the GSL, the word line and the SSL sequentially stacked and spaced apart from one another from the top surface of the substrate 100. For example, a lowermost gate line 165a may serve as the GSL. The gate lines 165b and 165c on the GSL may serve as the word lines. An uppermost gate line 165d may serve as the SSL. The number of levels of the GSL, the word line and the SSL may be increased in consideration of the circuit design and the degree of integration of the vertical memory device.

A gate line stack structure may be defined by the gate lines 165, the insulating interlayers 102, and the channel rows included in the gate lines 165 and the insulating interlayers 102. A plurality of the gate line stack structures may be separated by the openings 140, and may be arranged along the third direction.

In example embodiments, the non-metal gate pattern 157 may be formed at a central portion of the gate line stack structure, and may extend in the second direction while surrounding the channel rows. The metal gate pattern 163 may be formed at a peripheral portion of the gate line stack structure, and may laterally surround the non-metal gate pattern 157.

As illustrated in FIG. 3, the metal gate pattern 163 may be formed in the second region II to define a step portion of the gate line stack structure.

According to example embodiments as described above, the non-metal gate layer 155 including, e.g., polysilicon may be formed in advance to fill the gap 145, and may be partially removed. A space from which the non-metal gate layer 155 may be removed (e.g., the recess 147) may be filled with the metal gate layer 160 or the metal gate pattern 163.

In example embodiments, the non-metal gate layer 155 formed in the gap 145 may not be removed, and a metal layer may be formed on the non-metal gate layer 155. The metal layer and the non-metal gate layer 155 may be reacted with each other by a thermal treatment. In this case, a portion of the non-metal gate layer 155 formed in the gap 145 may be transformed into a metal gate pattern including a metal silicide, and an unreacted portion of the non-metal gate layer 155 may be defined as a non-metal gate pattern.

The metal layer may be formed of Co or Ni, and the metal gate pattern may include cobalt silicide or nickel silicide.

Figure 15:
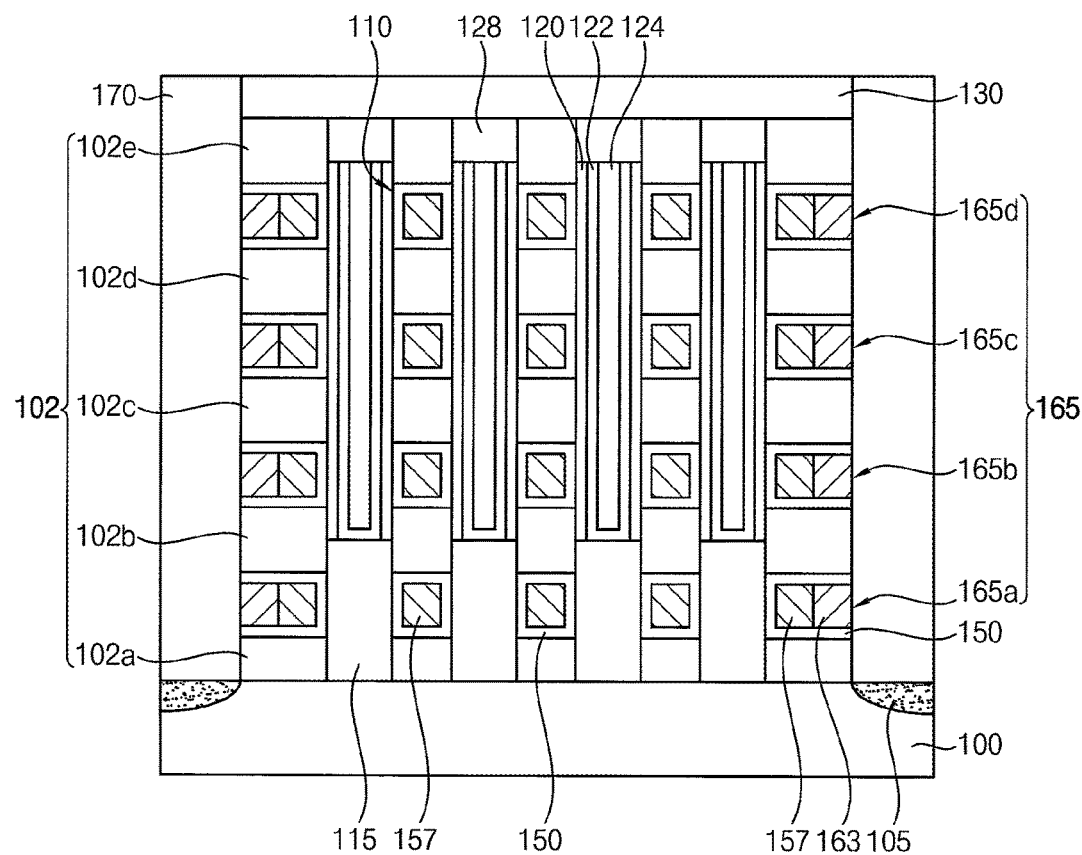

Referring to FIG. 15, an ion-implantation process may be performed to form an impurity region 105 at an upper portion of the substrate 100 exposed through the opening 140. A cutting pattern 170 filling the opening 140 may be formed on the impurity region 105.

The impurity region 105 may extend in, e.g., the second direction, and may serve as a CSL of the vertical memory device. A metal silicide pattern may be further formed on the impurity region to reduce a resistance of the CSL.

The cutting pattern 170 may be formed by filling an insulation material such as silicon oxide in the opening 140. In example embodiments, the cutting pattern 170 may be substantially merged with the upper insulation layer.

As illustrated in FIG. 3, a contact 180 electrically connected to the gate line 165 at each level may be formed.

For example, the upper insulation layer 130 and the mold protection layer 108 may be partially removed to form a contact hole through which the step portion of the gate line 165 at each level may be formed.

In example embodiments, the interface layer 150 formed on the step portion may be also partially removed while forming the contact hole. Thus, the metal gate pattern 163 of the step portion may be exposed through the contact hole.

A conductive layer filling the contact holes may be formed on the upper insulation layer 130, and an upper portion of the conductive layer may be planarized by, e.g., a CMP process to form the contacts 180.

In example embodiments, the contact 180 may be in contact with the metal gate pattern 163 at each level. Accordingly, a resistance between the contact 180 and the gate line 165 may be reduced.

Figure 16:
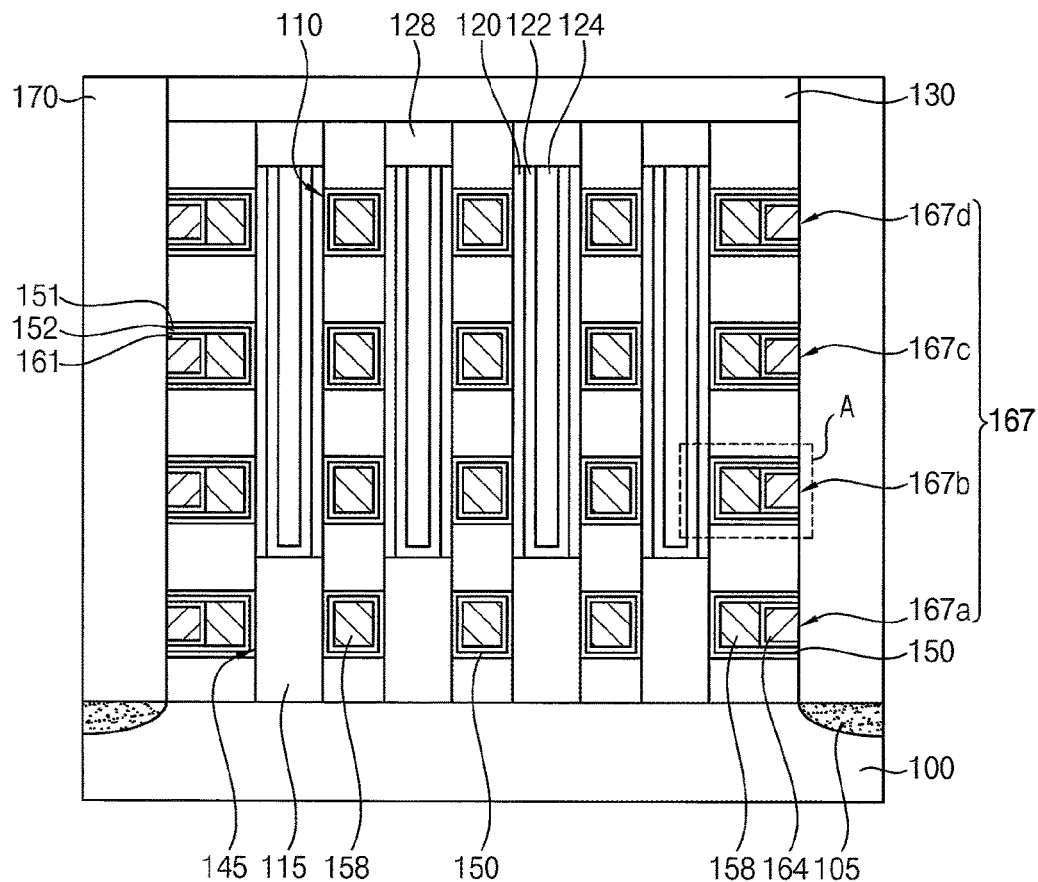
FIG. 16 is a cross-sectional view illustrating a vertical memory device in accordance with example embodiments.
Figure 17:
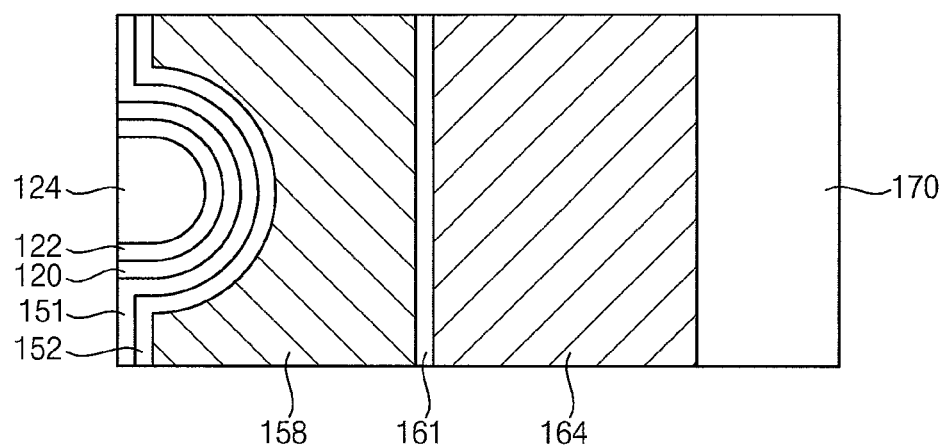
FIG. 17 is a partially enlarged cross-sectional view of a portion "A" indicated in FIG. 16.

FIG. 16 is a cross-sectional view illustrating a vertical memory device in accordance with example embodiments. FIG. 17 is a partially enlarged cross-sectional view of a portion "A" indicated in FIG. 16. Specifically, FIG. 17 is a cross-sectional view of the portion "A" taken along a parallel direction with respect to a top surface of the substrate 100.

The vertical memory device of FIGS. 16 and 17 may have elements and/or constructions substantially the same as or similar to those illustrated in FIGS. 1 to 3 except for a structure of an interface layer formed in the gap 145. Thus, detailed descriptions on repeated elements and/or structures are omitted herein. Like reference numerals are used to designate like elements.

Referring to FIGS. 16 and 17, a gate line 167 (e.g., 167a through 167d) may include a non-metal gate pattern 158 containing a silicon compound such as polysilicon, and a metal gate pattern 164 containing a metal such as W. An interface layer partially surrounding the non-metal gate pattern 158 and the metal gate pattern 164 may be formed in the gap 145 at each level.

The interface layer may include a first interface layer 151, a second interface layer 152 and a third interface layer 161.

In example embodiments, the first interface layer 151 may be formed on an outer sidewall of the dielectric layer structure 120, and a top surface and a bottom surface of the insulating interlayers 102 which may define the gap 145 at each level. The first interface layer 151 may be formed of a metal oxide, e.g., aluminum oxide.

The second interface layer 152 may be formed on the first interface layer 151. The second interface layer 152 may be formed of a metal nitride such as titanium nitride or tantalum nitride.

As described above, a multi-layered interface layer structure including different materials may be interposed between the vertical channel structure and the non-metal gate pattern 158. Thus, a work function in each memory cell may be finely controlled.

The third interface layer 161 may be formed between the non-metal gate pattern 158 and the metal gate pattern 164. The third interface layer 161 may serve as a barrier for blocking a material diffusion between the non-metal gate pattern 158 and the metal gate pattern 164. The third interface layer 161 may also serve as a buffer layer for reducing a contact resistance between the non-metal gate pattern 158 and the metal gate pattern 164.

In example embodiments, the third interface layer 161 may be formed of a metal nitride, e.g., tungsten nitride.

Figure 18:
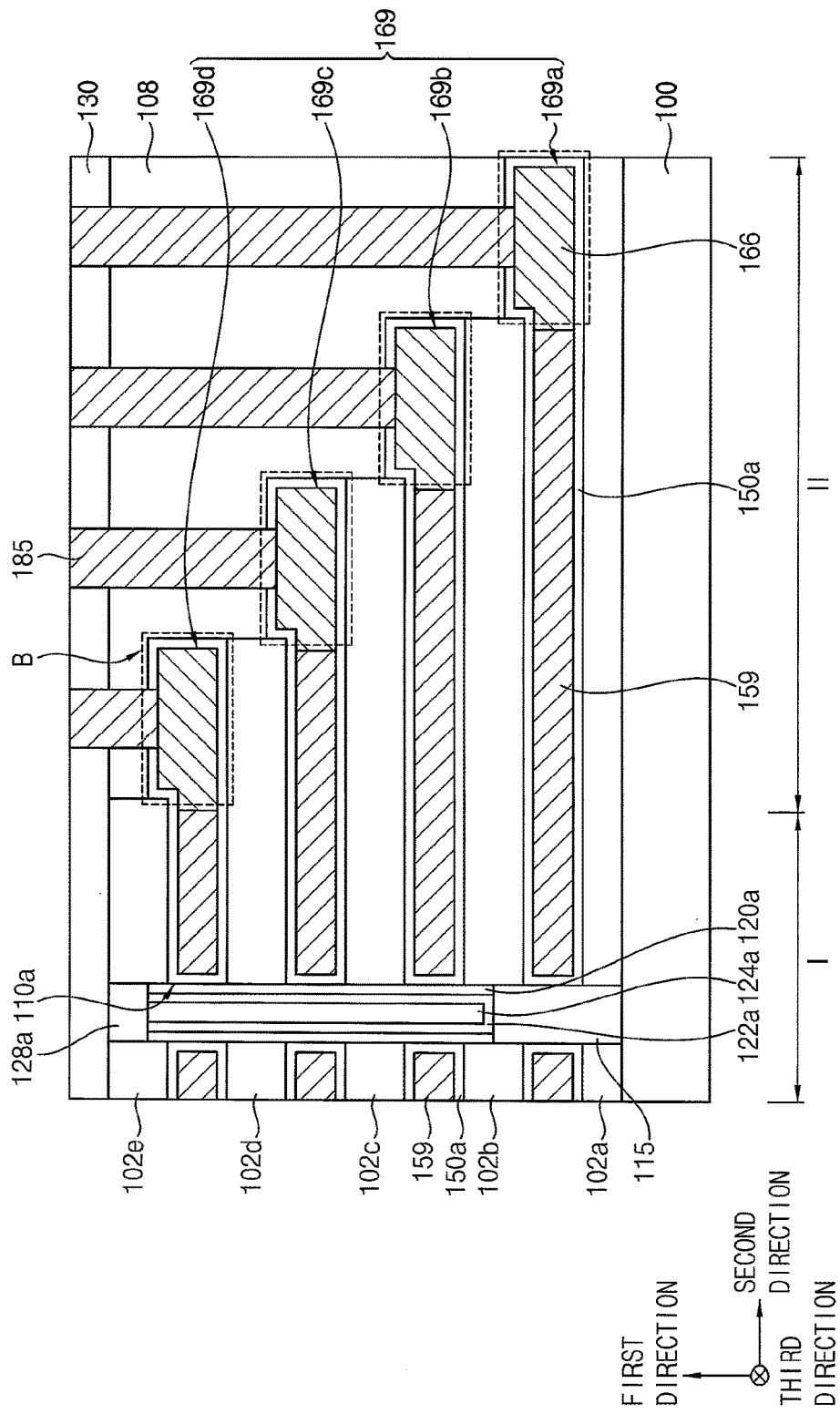
FIG. 18 is a cross-sectional view illustrating a vertical memory device in accordance with example embodiments.

FIG. 18 is a cross-sectional view illustrating a vertical memory device in accordance with example embodiments.

The vertical memory device of FIG. 18 may have elements and/or constructions substantially the same as or similar to those illustrated in FIGS. 1 to 3 except for a step portion of each gate line in the second region II (designated as a portion "B" with a dotted quadrangle). Thus, detailed descriptions on repeated elements and/or structures are omitted herein. Like reference numerals are used to designate like elements.

Referring to FIG. 18, a gate line 169 (e.g., 169a through 169d) may include a non-metal gate pattern 159 and a metal gate pattern 166. An interface layer 150a may be formed in a gap at each level to partially surround the gate line 169.

The step portion may consist essentially of the metal gate pattern 166, and the non-metal gate pattern 158 may not be included in the step portion.

In example embodiments, the metal gate pattern 166 of the step portion may have a height or a thickness greater than that of the non-metal gate pattern 159. As illustrated in FIG. 18, the metal gate pattern 166 may have a protrusion in the first direction at the step portion.

The non-metal gate pattern 159 may be arranged at a central portion of a gate line stack structure to limited (and/or prevent) a warpage of the gate line stack structure. The metal gate pattern 166 having an increased volume may be formed at the step portion and/or a peripheral portion of the gate line stack structure so that a resistance of the gate line 169 may be reduced. Therefore, a mechanical stability and an electrical reliability of the vertical memory device may be improved.

A contact 185 may extend through, e.g., the upper insulation layer 130, the mold protection layer 108 and a portion of the interface layer 150a formed at the step portion to be landed on the protrusion of the metal gate pattern 166.

FIGS. 19 to 29 are cross-sectional views illustrating a method of manufacturing a vertical memory device in accordance with example embodiments. Specifically, FIGS. 19 to 29 are cross-sectional views taken along a line III-III' indicated in FIG. 1.

For example, FIGS. 19 to 29 illustrate a method of manufacturing the vertical memory device illustrated in FIG. 18. Detailed descriptions on processes substantially the same as or similar to those illustrated with reference to FIGS. 4 to 15 are omitted herein.

Figure 19:
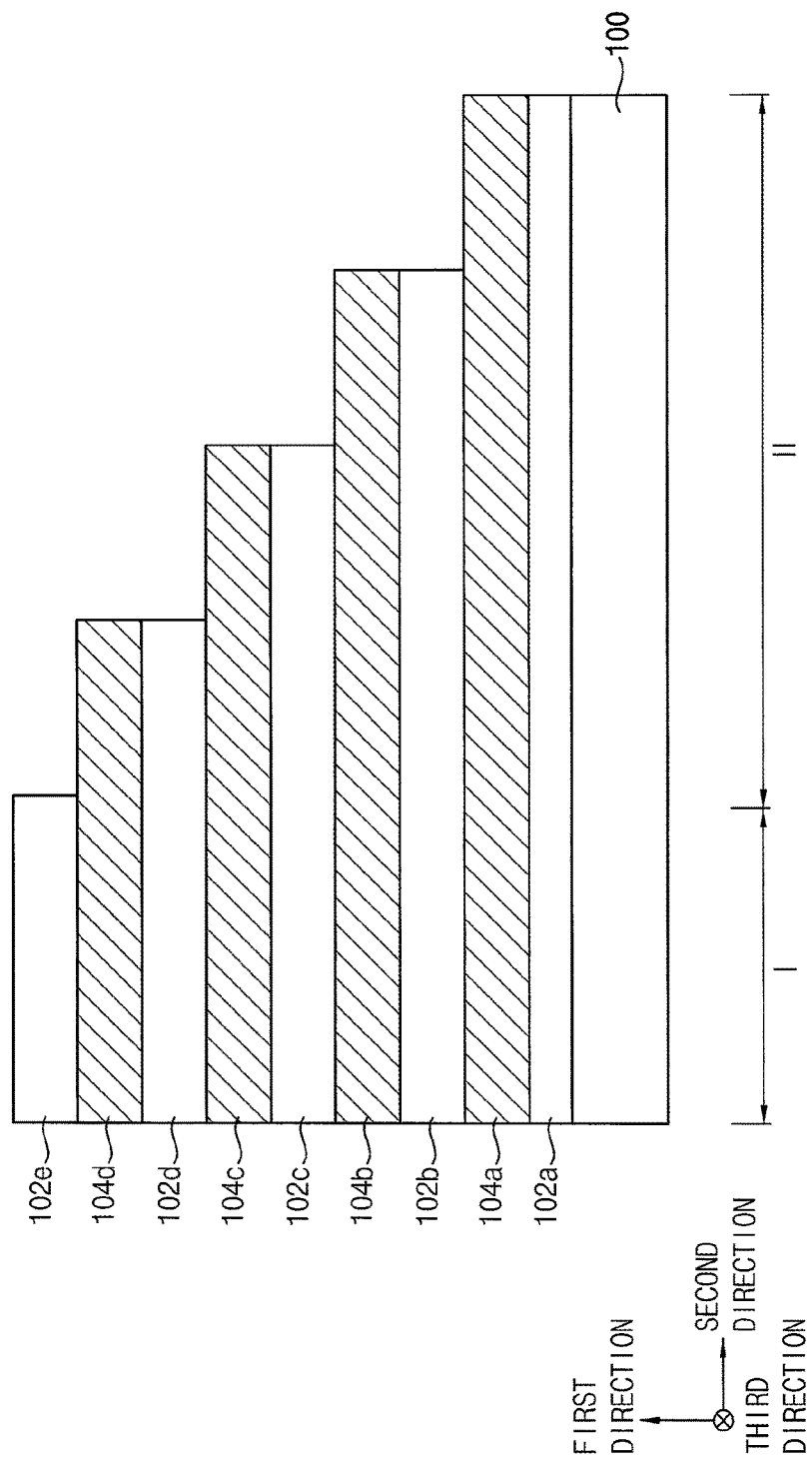
FIGS. 19 to 29 are cross-sectional views illustrating a method of manufacturing a vertical memory device in accordance with example embodiments.

Referring to FIG. 19, a process substantially the same as or similar to that illustrated with reference to FIG. 4 may be performed.

In example embodiments, insulating interlayers 102 (e.g., 102a through 102e) and sacrificial layers 104 (e.g., 104a through 104d) may be alternately and repeatedly formed on a substrate 100 including a first region I and a second region II to form a mold structure.

A portion of the mold structure on the second region II may be etched in a stepwise manner by a plurality of photo-lithography processes to form a stepped mold structure as illustrated in FIG. 19.

Figure 20:
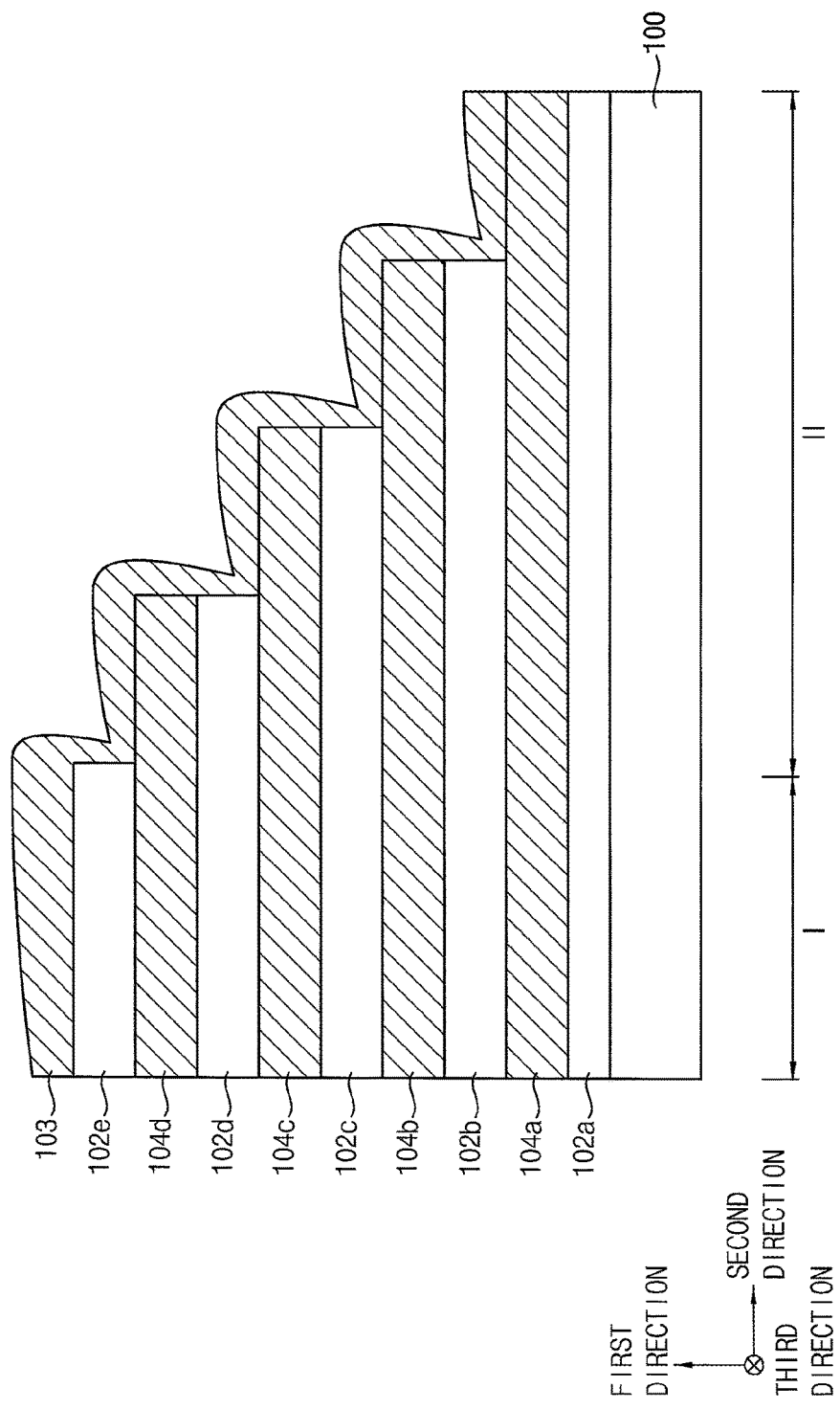

Referring to FIG. 20, an additional sacrificial layer 103 may be formed on the stepped mold structure.

In example embodiments, the additional sacrificial layer 103 may be formed of a nitride-based material substantially the same as or similar to that included in the sacrificial layer 104.

In example embodiments, the additional sacrificial layer 103 may be formed of silicon nitride by a deposition process under a low step-coverage condition. As illustrated in FIG. 20, the additional sacrificial layer 103 may be relatively thin on sidewalls of the stepped mold structure, and may be relatively thick on top surfaces of the stepped mold structure.

Figure 21:
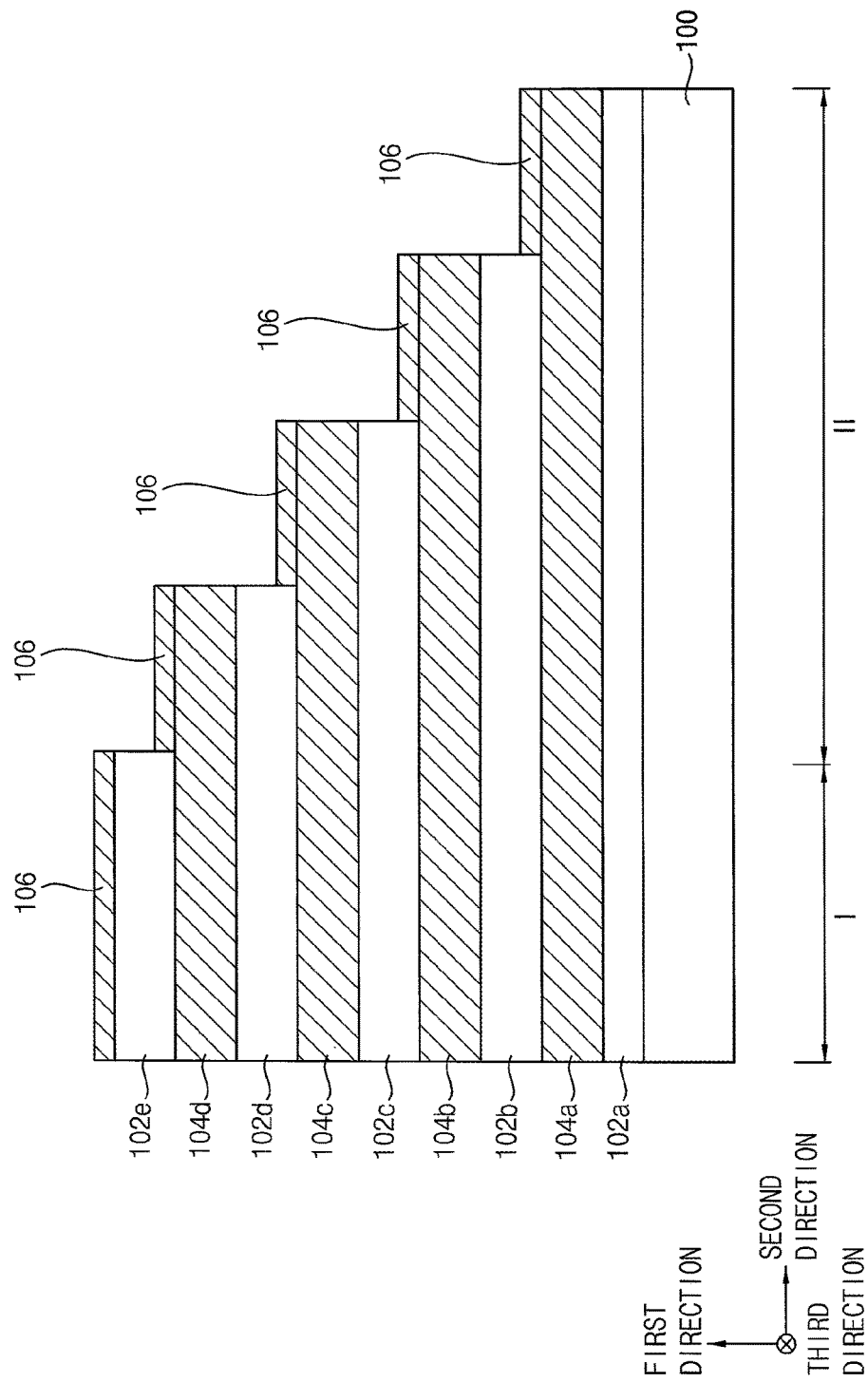

Referring to FIG. 21, the additional sacrificial layer 103 may be partially removed to form an additional sacrificial pattern 106.

In example embodiments, portions of the additional sacrificial layer 103 formed on the sidewalls of the stepped mold structure may be substantially etched. Portions of the additional sacrificial layer 103 formed on the top surfaces of the stepped mold structure may partially remain to form the additional sacrificial pattern 106.

The additional sacrificial pattern 103 may be formed on the top surface of the stepped mold structure at each step. In example embodiments, the additional sacrificial pattern 106 may be substantially merged with the sacrificial layer 104.

Figure 22:
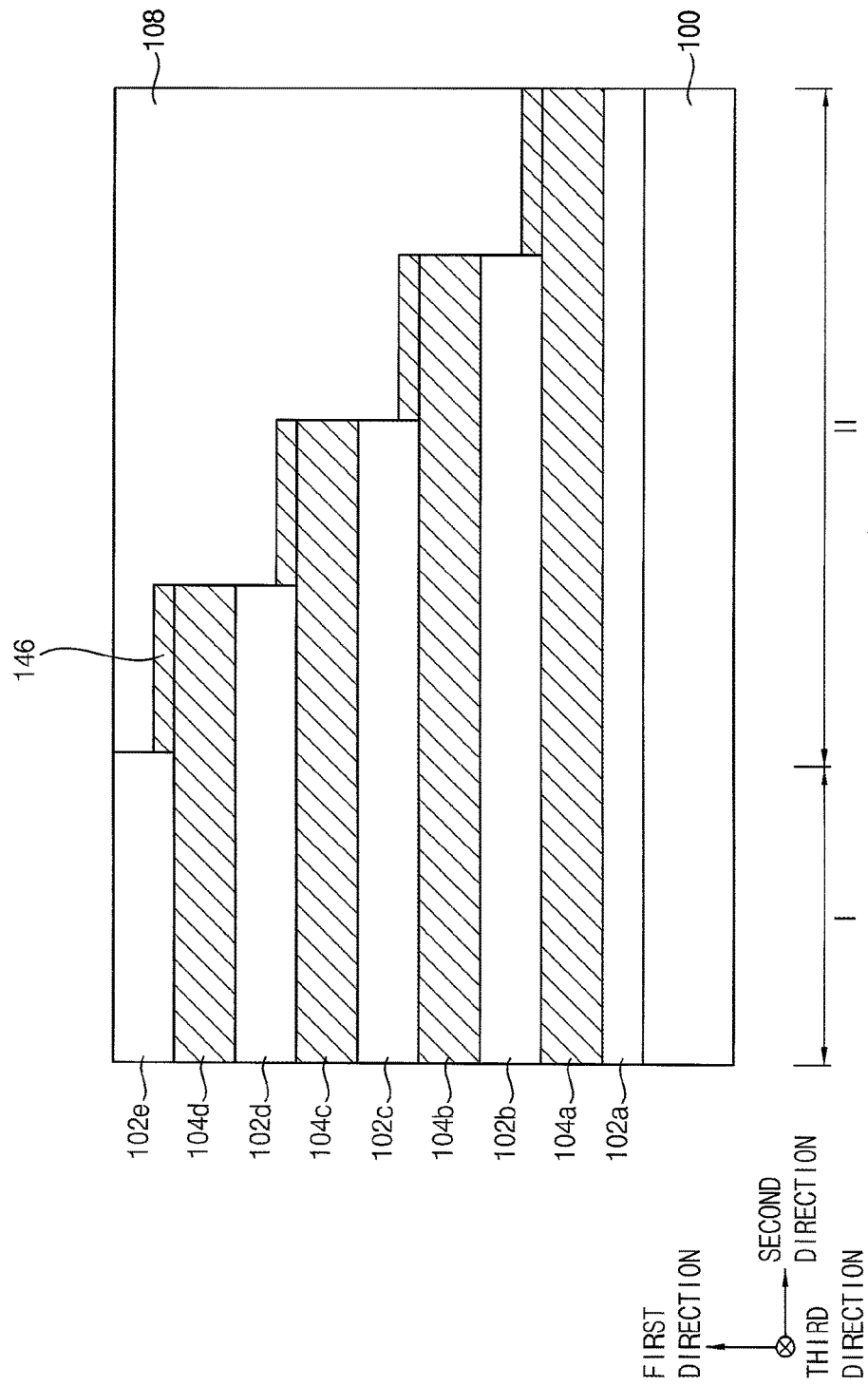

Referring to FIG. 22, a mold protection layer 108 covering a lateral portion of the stepped mold structure may be formed.

In example embodiments, the mold protection layer 108 may be formed on the stepped mold structure and the additional sacrificial pattern 106, and an upper portion of the mold protection layer 108 may be planarized by a CMP process. An uppermost additional sacrificial pattern may be removed by the CMP process, and a top surface of an uppermost insulating interlayer 102e may be exposed again.

Figure 23:
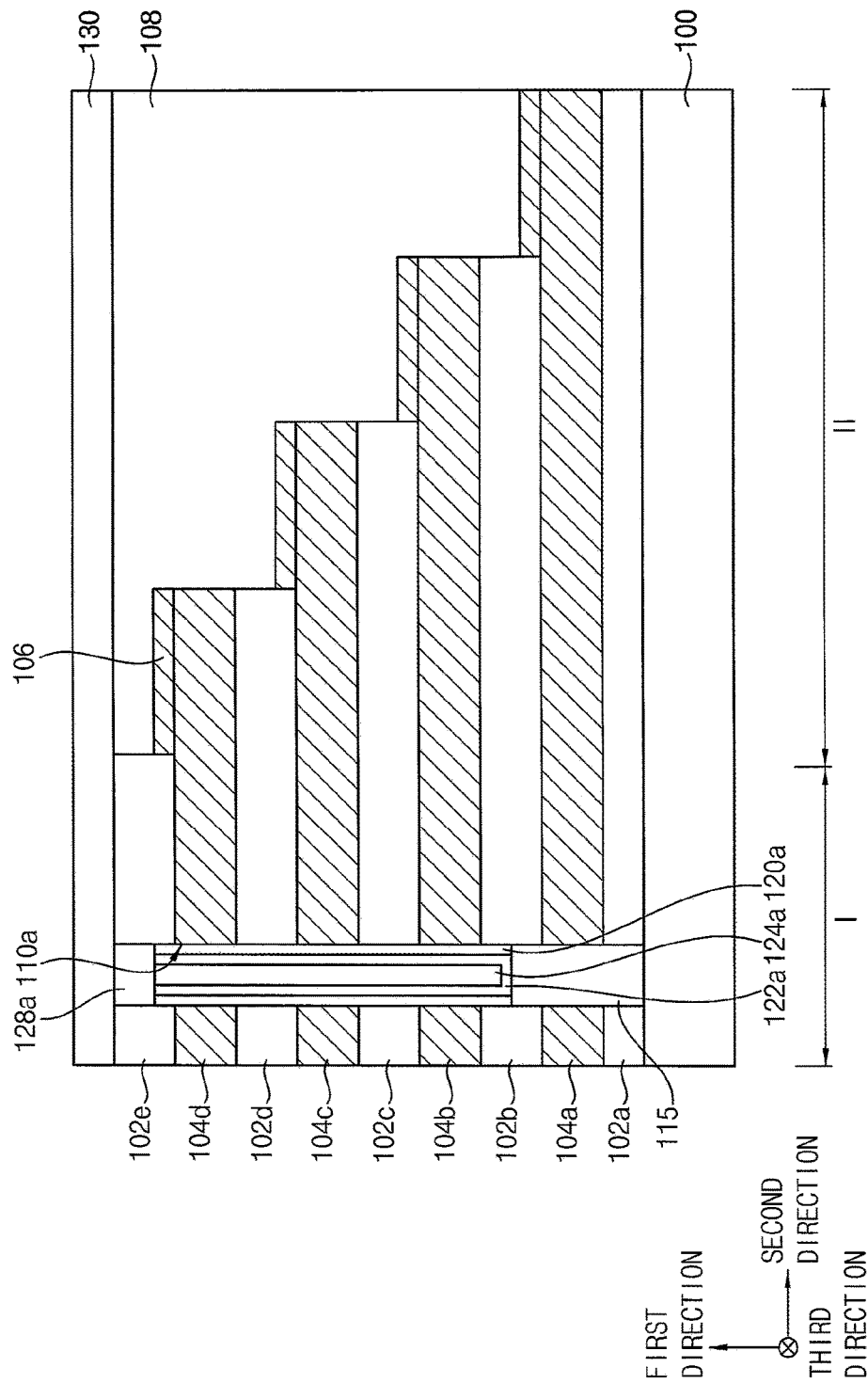

Referring to FIG. 23, processes substantially the same as or similar to those illustrated with reference to FIGS. 5 to 8 may be performed.

In example embodiments, a channel hole extending through the stepped mold structure in the first region I may be formed. A semiconductor pattern 115 may be formed at a lower portion of the channel hole, and a vertical channel structure including a dielectric layer structure, a channel and a filling insulation pattern may be formed on the semiconductor pattern 115. A pad capping an upper portion of the channel hole may be formed on the vertical channel structure.

As illustrated in FIG. 23, a dummy channel hole 110a may be formed concurrently with the channel hole at a peripheral portion of the first region I adjacent to the second region II. A dummy vertical channel structure having a construction substantially the same as or similar to that of the vertical channel structure may be formed in the dummy channel hole 110a. The dummy vertical channel structure may include a dummy dielectric layer structure 120a, a dummy channel 122a and a dummy filling insulation pattern 124a. A dummy pad 128a capping an upper portion of the dummy channel hole 110a may be formed on the dummy vertical channel structure.

Subsequently, an upper insulation layer 130 covering the stepped mold structure, the pad, the dummy pad 128a and the mold protection layer 108 may be formed.

Figure 24:
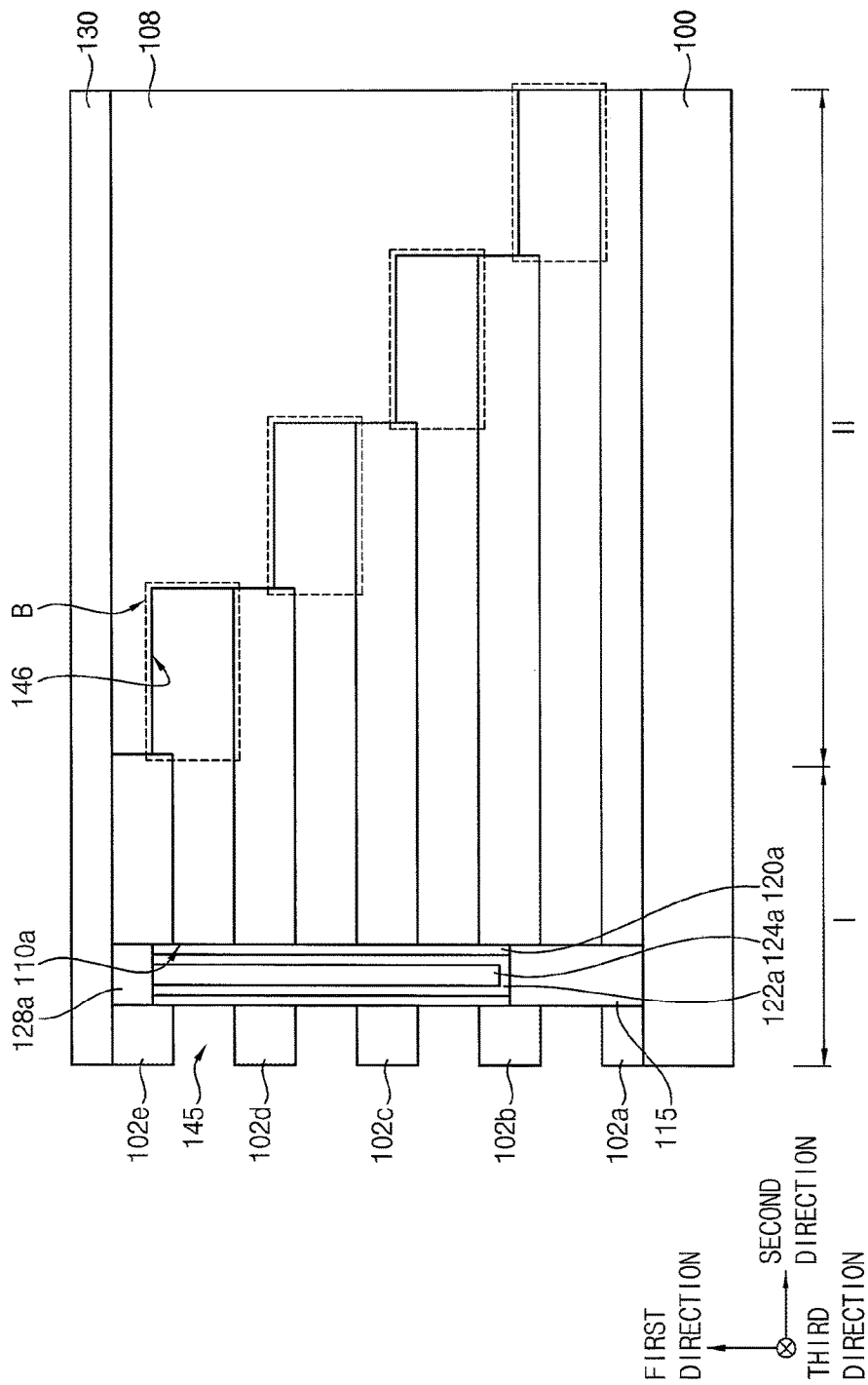

Referring to FIG. 24, processes substantially the same as or similar to those illustrated with reference to FIGS. 9 and 10 may be performed.

In example embodiments, an opening 140 (see FIG. 9) cutting the stepped mold structure and the mold protection layer 108 and extending in the second direction may be formed. The sacrificial layers 104 exposed through the opening 140 may be removed by a wet etching process using an etchant solution that may have an etching selectivity for the nitride-based material.

In example embodiments, the additional sacrificial pattern 106 may be also removed by the wet etching process together with the sacrificial layers 104. Accordingly, a gap 145 may be defined by a space from which the sacrificial layer 104 at each level may be removed, and an expanded gap 146 (designated as a dotted quadrangle) may be defined by a space from which the additional sacrificial pattern 106 may be removed together with the sacrificial layer 104.

The gaps 145 may be formed in the first region I, and the expanded gaps 146 may be formed in the second region II. The expanded gaps 146 may substantially correspond to step portions of the stepped mold structure. In example embodiments, the expanded gap 146 may have a height in the first direction greater than that of the gap 145.

Figure 25:
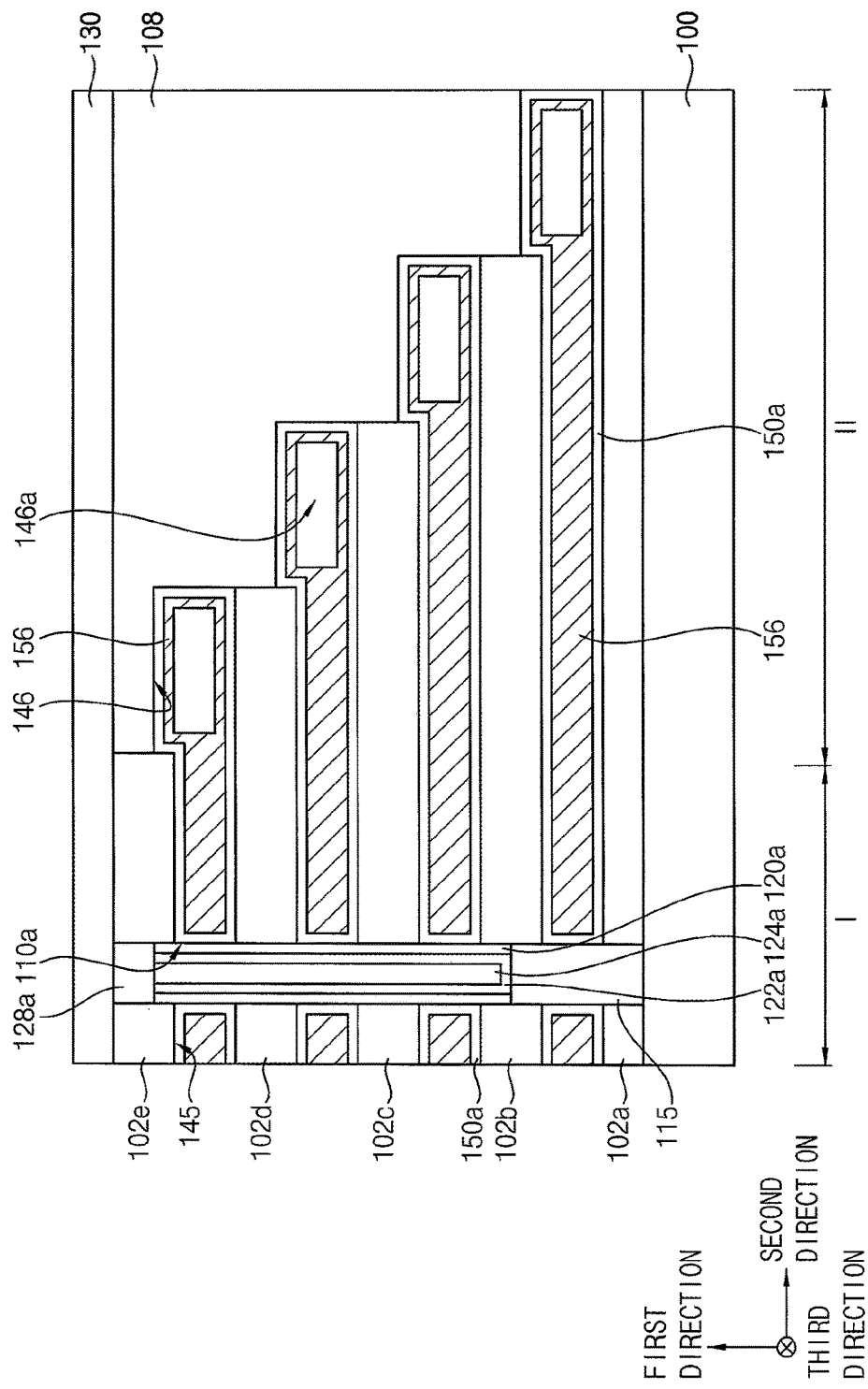

Referring to FIG. 25, a process substantially the same as or similar to that illustrated with reference to FIG. 11 may be performed. Accordingly, an interface layer 150a may be formed along inner walls of the gap 145 and the expanded gap 146 at each level, and a non-metal gate layer 156 filling the gap 145 and the expanded gap 146 may be formed on the interface layer 150a.

In example embodiments, for example, if the non-metal gate layer 156 is formed under deposition conditions (e.g., a deposition time or a deposition thickness) substantially the same as those in the process described with reference to FIG. 11, the expanded gap 146 may not be completely filled with the non-metal gate layer 156 due to an expanded volume thereof. Thus, a void 146a may be generated in the expanded gap 146 at each level.

Figure 26:
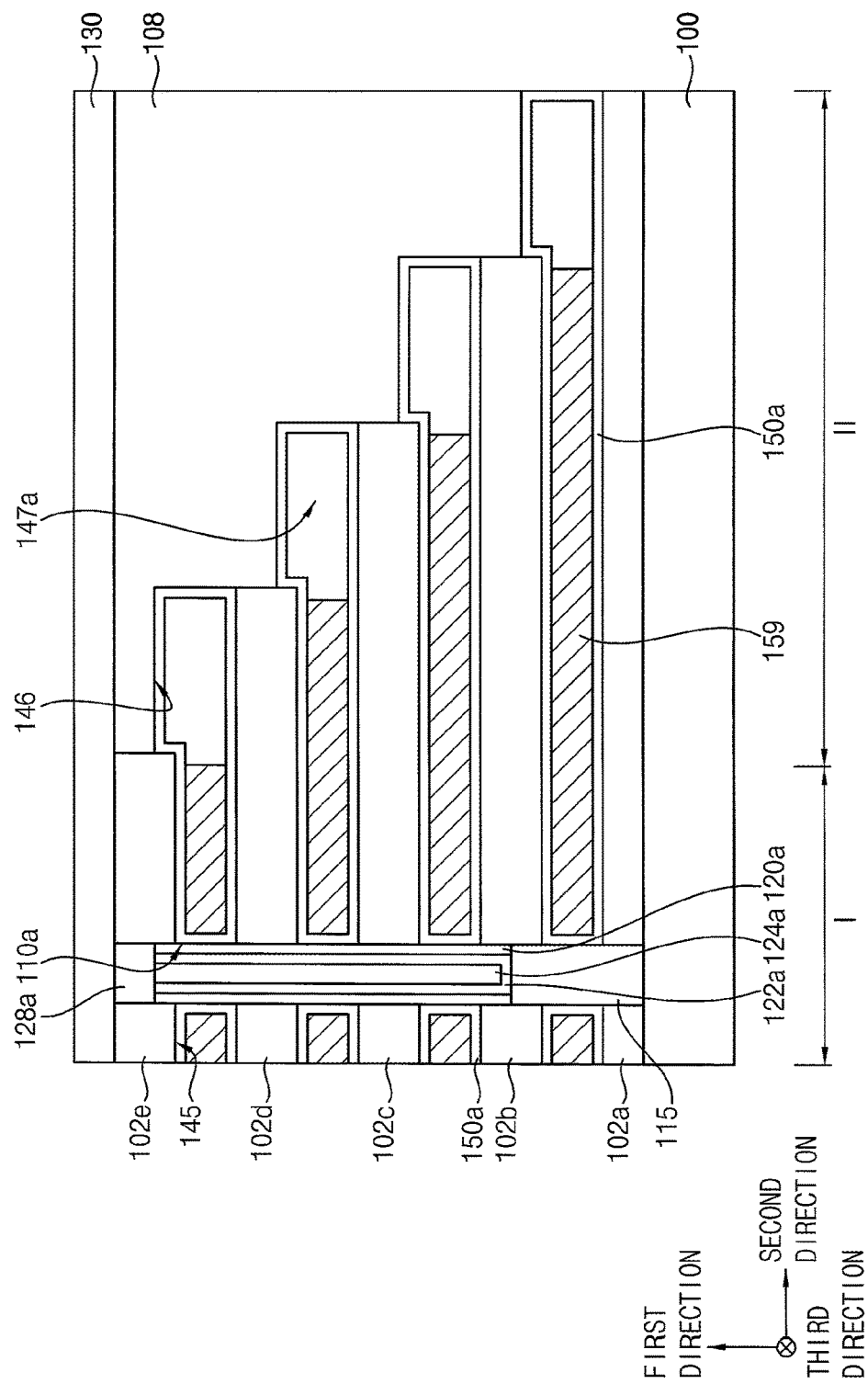

Referring to FIG. 26, a process substantially the same as or similar to that illustrated with reference to FIG. 12 may be performed to partially remove the non-metal gate layer 156.

In example embodiments, a portion of the non-metal gate layer 156 formed in the opening may be removed, and a portion of the non-metal gate layer 156 formed in the gap 145 may be partially removed. Further, a portion of the non-metal gate layer 156 formed in the expanded gap 146 may be substantially fully removed to from a recess 147a. Accordingly, a non-metal gate pattern 159 partially filling the gap 145 at each level may be formed.

In example embodiments, an etching amount of the non-metal gate layer 156 in the expanded gap 146 may be reduced by the void 146a. Thus, a removal of the non-metal gate layer 156 may be ensured in the expanded gap 146 or at each step portion.

Figure 27:
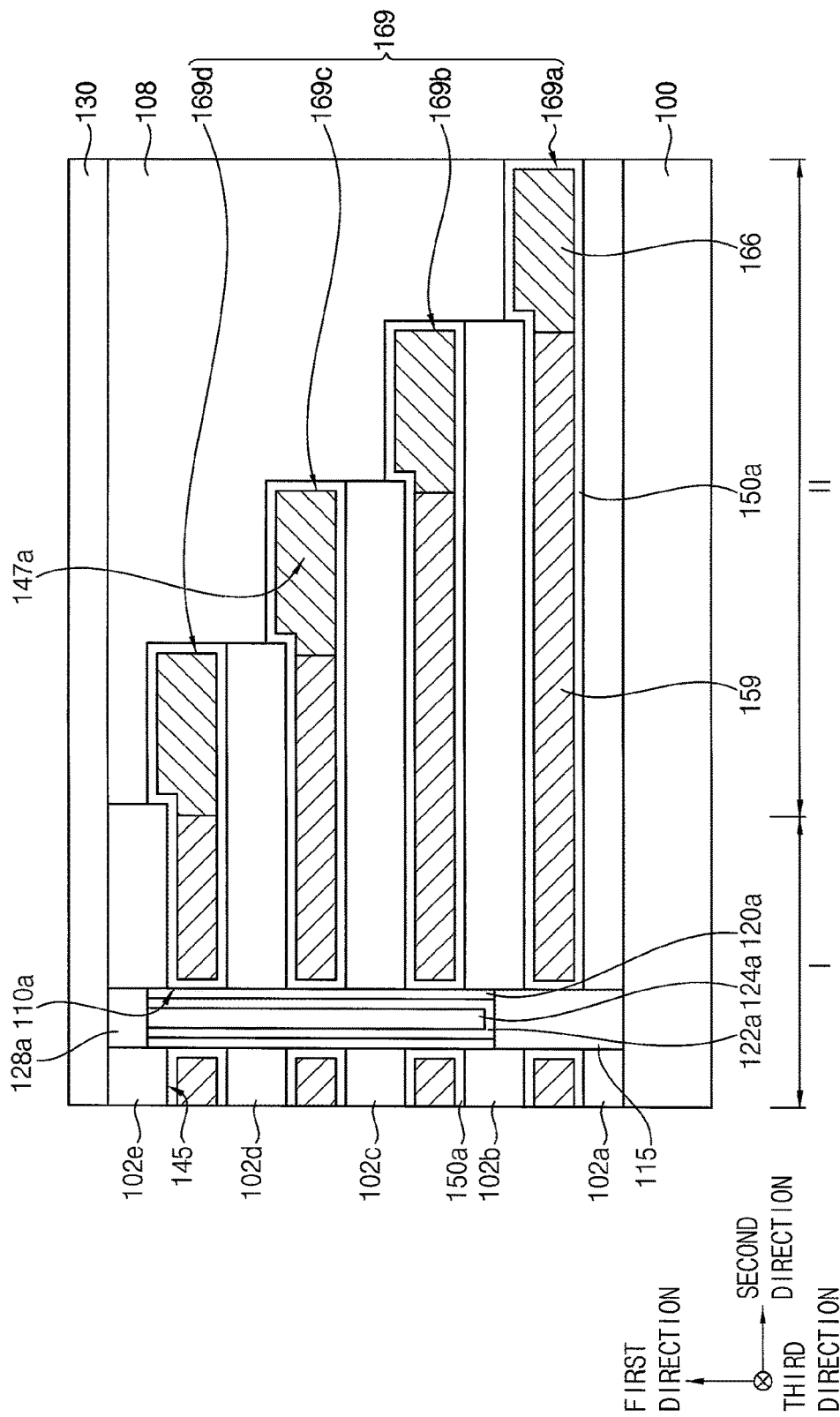

Referring to FIG. 27, processes substantially the same as or similar to those illustrated with reference to FIGS. 13 and 14 may be performed.

In example embodiments, a metal gate layer filling the recess 147a may be formed such that a metal gate pattern 166 may be formed at each step portion. The metal gate pattern 166 may fill the expanded gap 146, and may partially extend in the gap 145. The metal gate pattern 166 may include a protrusion in the first direction at the step portion.

Accordingly, a gate line 169 (e.g., 169a through 169d) including the non-metal gate pattern 159 and the metal gate pattern 166 may be formed at each level between the insulating interlayers 102.

Subsequently, as also described with reference to FIG. 14, an impurity region may be formed at an upper portion of the substrate 100 exposed through the opening, and a cutting pattern filling the opening may be formed on the impurity region. A gate line stack structure may be defined by the cutting pattern. The gate line stack structure may include the gate lines 169 and insulating interlayers 102 alternately stacked along the first direction, and may include the vertical channel structures through the gate lines 169 and the insulating interlayers 102.

Figure 28:
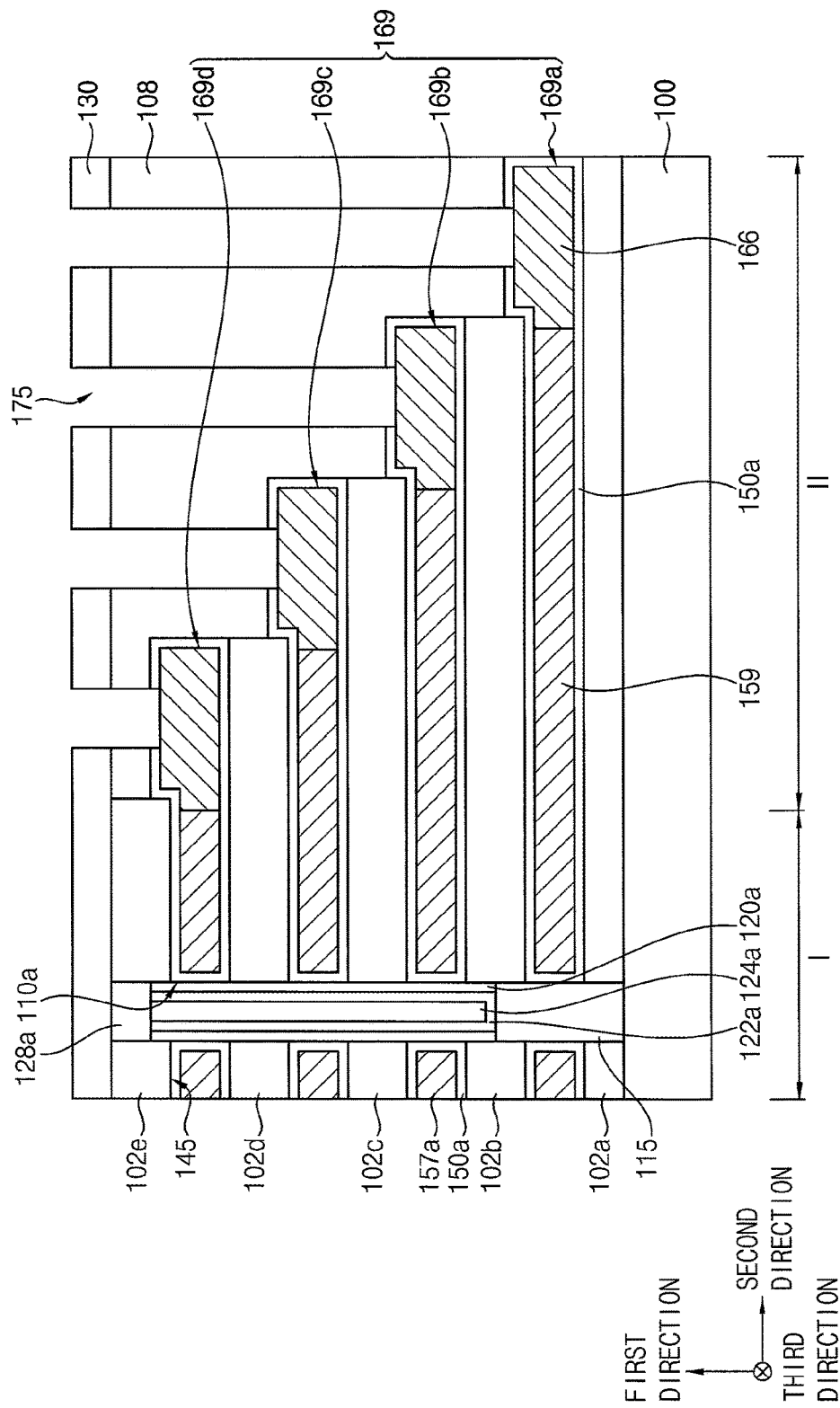

Referring to FIG. 28, the upper insulation layer 130 and the mold protection layer 108 may be partially removed to form contact holes 175.

In example embodiments, the contact hole 175 may extend through a portion of the interface layer 150a formed on the step portion to expose a top surface of the protrusion of the metal gate pattern 166.

Figure 29:
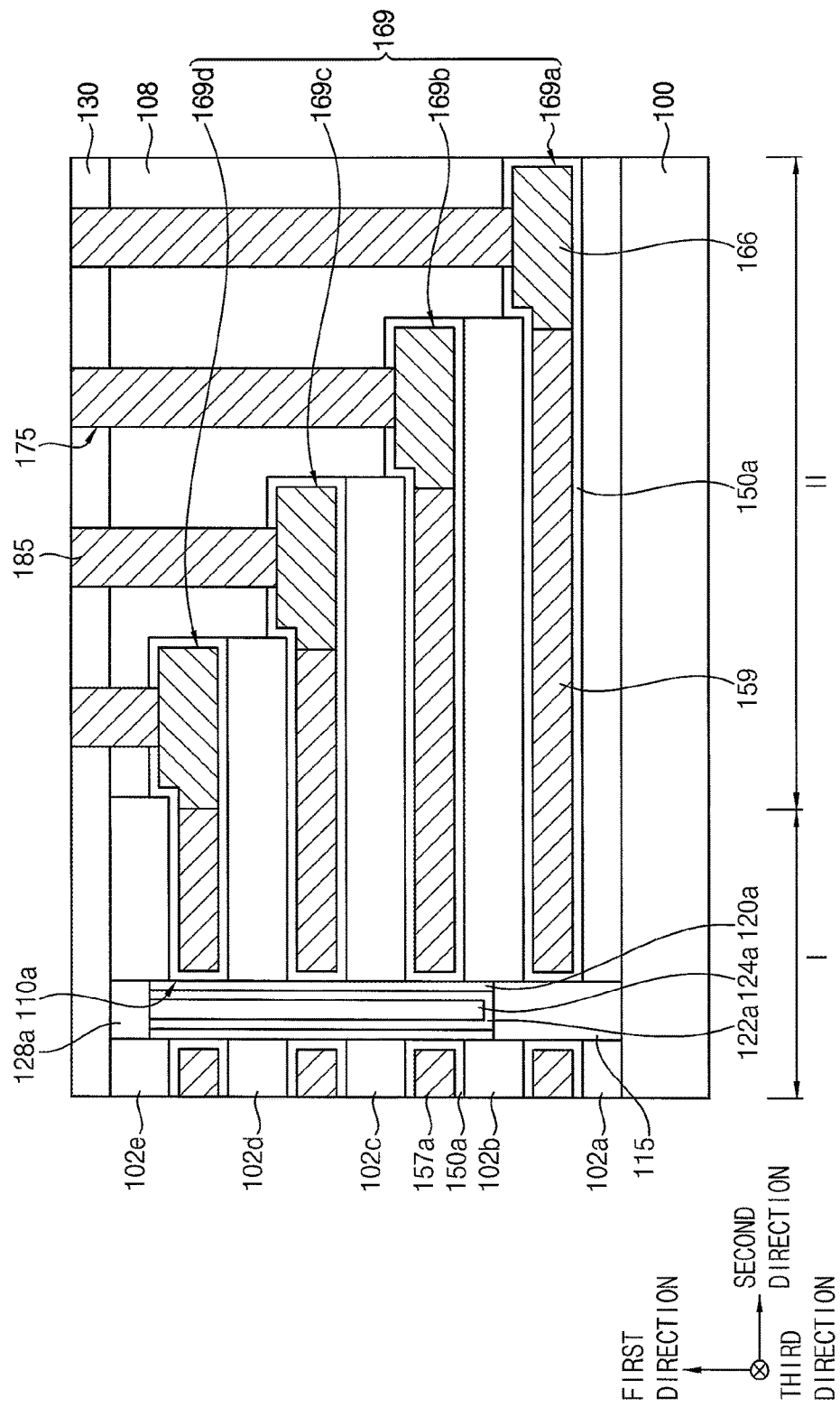

Referring to FIG. 29, a contact 185 may be formed in the contact hole 175.

For example, a conductive layer filling the contact holes 175 may be formed on the upper insulation layer 130. An upper portion of the conductive layer may be planarized by a CMP process until a top surface of the upper insulation layer 130 may be exposed to form the contacts 185.

In example embodiments, the contact 185 may be landed on the protrusion of the metal gate pattern 166 at each level.

According to example embodiments as described above, a removal of the non-metal gate layer 156 in the second region II or the step portion may be ensured through a formation of the expanded gap 146. Thus, the metal gate pattern 166 having an increased thickness may be formed at the step portion so that a resistance of each gate line 169 may be reduced.

In example embodiments, the method in FIGS. 19-29 may be modified to form the vertical memory device in FIG. 3 of the present application, where a height of the non-metal gate pattern 157 and the metal gate pattern 163 are about equal (or equal) by omitting the operations of forming the additional sacrificial layer 103 and the additional sacrificial pattern 106 in FIGS. 19-20 of the present application. If the additional sacrificial pattern 106 is omitted in FIGS. 21-23 of the present application, then the height of the expanded gap 146 in FIG. 24 of the present application may be the same as the height of the gap 145.

According to example embodiments of inventive concepts, a gate line of each level of a vertical memory device may include a non-metal gate pattern containing, e.g., polysilicon, and a metal gate pattern. The non-metal gate pattern may surround vertical channels, and may be arranged at a central area of a gate line stack structure. The metal gate pattern may be arranged at a peripheral area, e.g., a step portion of the gate line stack structure. Thus, a warpage of the vertical memory device may be suppressed, and an electrical resistance of each gate line may be reduced.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A vertical memory device, comprising:
a substrate including a first region and a second region;
a plurality of channels on the first region of the substrate, the channels extending in a vertical direction with respect to a top surface of the substrate;
a plurality of non-metal gate patterns surrounding the channels, the plurality of non-metal gate patterns being stacked on top of each other on the first region of the substrate and spaced apart from each other along the vertical direction; and
a plurality of metal gate patterns stacked on top of each other on the second region of the substrate and spaced apart from each other along the vertical direction, each of the plurality of metal gate patterns surrounding a corresponding one of the plurality of non-metal gate patterns, wherein
the vertical memory device does not include any of the plurality of metal gate patterns on the first region of the substrate.

2. The vertical memory device of claim 1, wherein the plurality of non-metal gate patterns include polysilicon.

3. The vertical memory device of claim 1, wherein the plurality of metal gate patterns include at least one of a metal and a metal silicide.

4. The vertical memory device of claim 1, wherein
the plurality of non-metal gate patterns and the plurality of metal gate patterns define a plurality of gate lines,
each of the gate lines includes one of the plurality of non-metal gate patterns and one of the plurality of metal gate patterns at a same level, and
the plurality of the gate lines are stacked on top of each other and spaced apart from each other along the vertical direction.

5. The vertical memory device of claim 4, further comprising:
insulating interlayers between the plurality of gate lines,
wherein the insulating interlayers are stacked on top of each other and spaced apart from each other along the vertical direction.

6. The vertical memory device of claim 5, further comprising:
interface layers surrounding the plurality of gate lines, wherein
the interface layers are between the insulating interlayers and the plurality of gate lines at each level.

7. The vertical memory device of claim 6, wherein
the interface layers each include a first interface layer, a second interface layer on the first interface layer; and a third interface layer selectively surrounding one of the plurality of metal gate patterns,
the first interface layer and the second interface layer commonly surround one of the plurality of non-metal gate patterns and one of the plurality of metal gate patterns.

8. The vertical memory device of claim 7, wherein
the first interface layer includes a metal oxide, and
the second interface layer and the third interface layer include a metal nitride.

9. The vertical memory device of claim 6, wherein a space between the plurality of channels is fully filled with the interface layers and the plurality of non-metal gate patterns.

10. The vertical memory device of claim 4, wherein
the plurality of gate lines are stacked in a stepped shape from the top surface of the substrate, and
the plurality of gate lines at each level includes a step portion protruding in a horizontal direction.

11. The vertical memory device of claim 10, the step portion consists essentially of the plurality of metal gate patterns.

12. The vertical memory device of claim 11, wherein the metal gate patterns include protrusions expanding in the vertical direction.

13. The vertical memory device of claim 11, further comprising:
contacts electrically connected to the step portion of the plurality of gate lines at each level.

14. A vertical memory device, comprising:
a substrate;
insulating interlayers stacked on top of each other and spaced apart from each other along a vertical direction with respect to a top surface of the substrate;
a plurality of channels extending through the insulating interlayers in the vertical direction;
a plurality of non-metal gate patterns stacked on top of each other and spaced apart from each other along the vertical direction, the plurality of non-metal gate patterns partially filling gaps defined by the insulating interlayers and the plurality of channels, the gaps including spaces between the plurality of channels, the spaces being filled with the plurality of non-metal gate patterns; and
a plurality of metal gate patterns stacked on top of each other and spaced apart from each other along the vertical direction, the plurality of metal gate patterns partially filling remaining portions of the gaps such that the plurality of metal gate patterns are only disposed around the plurality of non-metal gate patterns and each one of the plurality of metal gate patterns is farther away from a nearest channel among the plurality of channels compared to a distance between an adjacent one of the plurality of non-metal gate patterns and the nearest channel.

15. The vertical memory device of claim 14, wherein
the plurality of non-metal gate patterns are on a first region of the substrate and define channel holes,
the plurality of channels are arranged in an array on the first region of the substrate and extend through the channel holes,
the plurality of metal gate patterns are on a second region of the substrate,
the plurality of metal gate patterns extend from the plurality of non-metal gate patterns in a direction away from the array of the plurality of channels, and
the plurality of metal gate patterns are not arranged on the first region.

* * * * *

UNITED STATES PATENT AND TRADEMARK OFFICE
CERTIFICATE OF CORRECTION

PATENT NO. : 10,079,203 B2  
APPLICATION NO. : 15/271605  
DATED : September 18, 2018  
INVENTOR(S) : Yong-Hoon Son et al.

Page 1 of 1

It is certified that error appears in the above-identified patent and that said Letters Patent is hereby corrected as shown below:

On the Title Page

Item (73), should read:  
Assignee: Samsung Electronics Co., Ltd., Gyeonggi-do (KR)

Signed and Sealed this  
Third Day of September, 2019

Andrei Iancu  
*Director of the United States Patent and Trademark Office*